United States Patent
Lin

(10) Patent No.: US 9,437,738 B2
(45) Date of Patent: Sep. 6, 2016

(54) FIELD EFFECT TRANSISTOR WITH HETEROSTRUCTURE CHANNEL

(71) Applicant: TAIWAN SEMICONDUCTOR MANUFACTURING COMPANY LTD., Hsinchu (TW)

(72) Inventor: Chien-Ming Lin, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 40 days.

(21) Appl. No.: 14/175,341

(22) Filed: Feb. 7, 2014

(65) Prior Publication Data

US 2015/0228782 A1  Aug. 13, 2015

(51) Int. Cl.

| | |
|---|---|
| *H01L 29/06* | (2006.01) |
| *H01L 29/78* | (2006.01) |
| *H01L 29/165* | (2006.01) |
| *H01L 29/205* | (2006.01) |
| *H01L 29/66* | (2006.01) |
| *H01L 29/775* | (2006.01) |
| *H01L 29/423* | (2006.01) |
| *B82Y 10/00* | (2011.01) |

(52) U.S. Cl.
CPC ............. *H01L 29/785* (2013.01); *B82Y 10/00* (2013.01); *H01L 29/068* (2013.01); *H01L 29/0673* (2013.01); *H01L 29/165* (2013.01); *H01L 29/205* (2013.01); *H01L 29/42392* (2013.01); *H01L 29/66439* (2013.01); *H01L 29/66795* (2013.01); *H01L 29/775* (2013.01)

(58) Field of Classification Search
CPC ............. H01L 29/0673; H01L 29/068; H01L 29/66439; H01L 29/42392; H01L 29/125; B82Y 10/00
See application file for complete search history.

(56) References Cited

U.S. PATENT DOCUMENTS

| | | | |
|---|---|---|---|
| 2008/0169484 A1* | 7/2008 | Chuang et al. ................ | 257/190 |
| 2010/0252801 A1* | 10/2010 | Sekaric .................. | B82Y 10/00 257/9 |
| 2010/0252862 A1* | 10/2010 | Ko et al. ........................ | 257/192 |
| 2011/0147842 A1* | 6/2011 | Cappellani et al. .......... | 257/365 |

OTHER PUBLICATIONS

Taiwan office action dated Jan. 13, 2016 issued from the Taiwan Intellectual Property Office.

* cited by examiner

*Primary Examiner* — Su C Kim
(74) *Attorney, Agent, or Firm* — WPAT, P.C. Intellectual Property Attorneys; Anthony King

(57) ABSTRACT

In some embodiments, an FET structure comprises a heterostructure, and a gate structure. The heterostructure comprises a first section, a barrier section and a second section such that a portion of the first section, the barrier section, and a portion of the second section form a channel region, and portions of the first section and the second section on opposite sides of the channel region form at least portions of source and drain regions, respectively. When the channel region is p type, the barrier section has a positive valence band offset with respect to each of the first section and the second section, or when the channel region is n type, the barrier section has a positive conduction band offset with respect to each of the first section and the second section. A gate structure is configured over the channel region.

18 Claims, 32 Drawing Sheets

FIELD EFFECT TRANSISTOR WITH HETEROSTRUCTURE CHANNEL

BACKGROUND

Transistor scaling has provided ever-increasing transistor performance and density for the past few decades. For example, scaling of a gate length of a transistor, also known as a channel length of a planar transistor, not only decreases a size of the transistor, but also enhances its on-state current. However, with the decrease of the channel length, short channel effects (SCEs) that significantly increases an off-state current of the transistor become a bottle neck for advancement of scaling of the channel length. Other techniques, such as the use of a high mobility channel, a channel region formed of a material with a mobility higher than that of silicon, and applying strain to the channel region are considered to further the progress of performance enhancement. Recently, non-planar transistors such as FinFET and nanowire FET are shown to be promising in reducing the off-state current by limiting a body thickness of the transistor, thereby breaking through the bottle neck that hinders the scaling roadmap. Many of performance enhancement techniques for planar transistors such as the use of the high mobility channel are being considered to be applied to the non-planar transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9 and 10A to 14A are schematic perspective diagrams of semiconductor structures formed by operations in a fabrication process of the nanowire FET structure in FIG. 8A in accordance with some embodiments.

FIGS. 10B to 14B are cross sectional diagrams along line B-B' in FIGS. 10A to 14A, respectively.

DETAILED DESCRIPTION

Figure 1A:
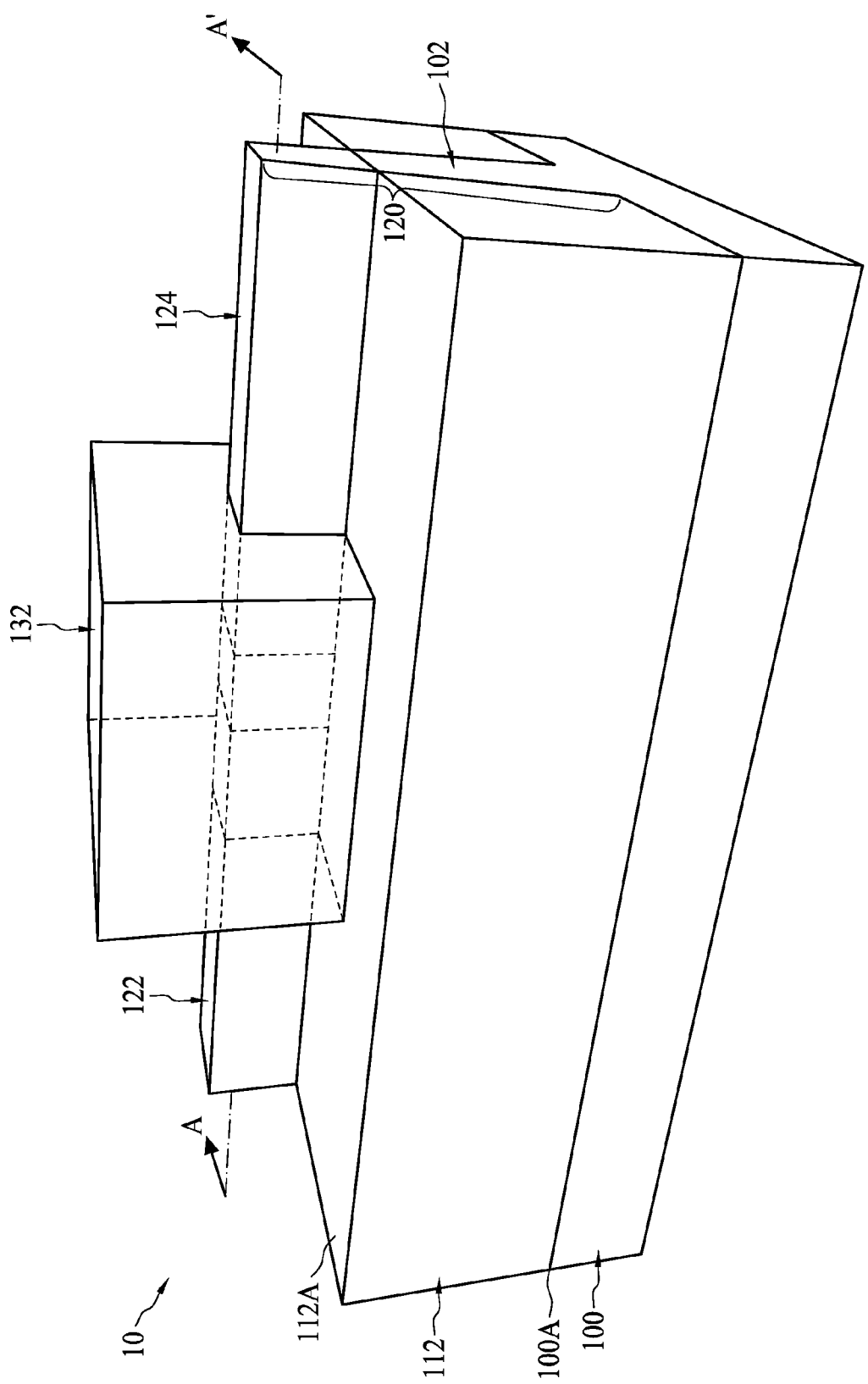
FIG. 1A is a schematic perspective diagram of a FinFET structure with a heterostructure channel region in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "under", "top", "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when a feature is "formed over" another feature or a substrate, intervening features may be present.

Figure 1B:
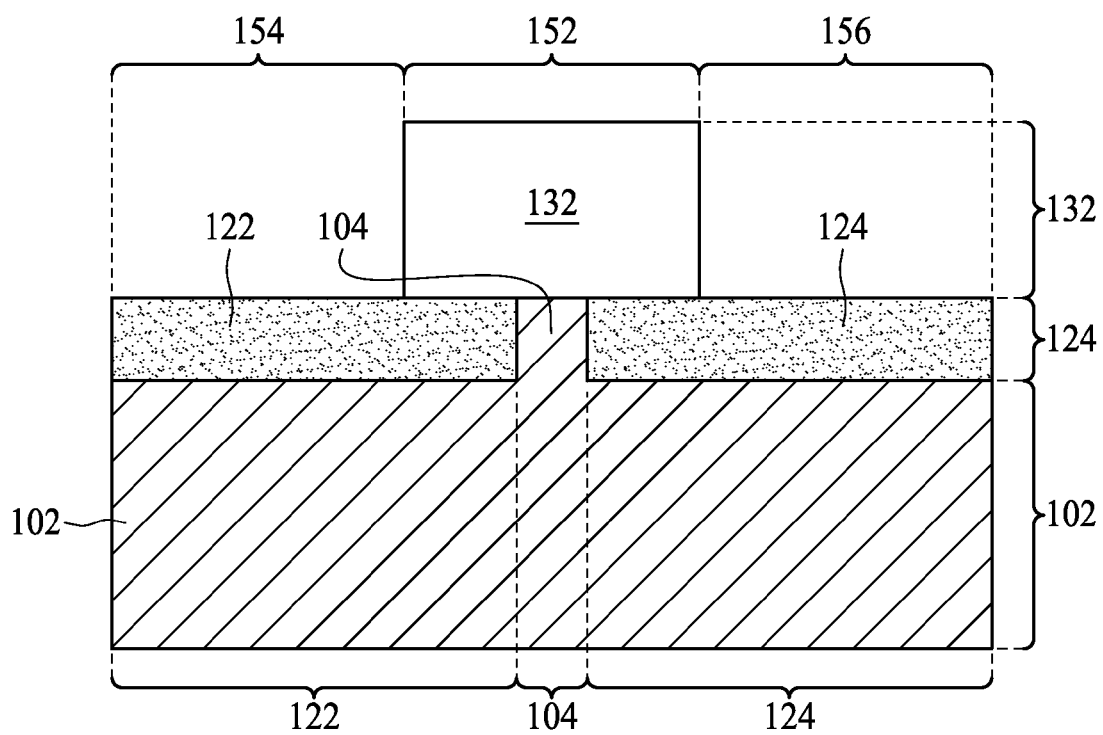
FIG. 1B is a cross sectional diagram along line A-A' in FIG. 1A in accordance with some embodiments.

FIG. 1A is a schematic perspective diagram of a FinFET structure 10 with a heterostructure channel region in accordance with some embodiments. FIG. 1B is a cross sectional diagram along line A-A' in FIG. 1A in accordance with some embodiments. FIGS. 1A and 1B illustrate that a fin structure 120 includes the heterostructure channel region 152 (labeled in FIG. 1B) formed of portions of high mobility sections 122 and 124 separated by a barrier section 104. Referring to FIG. 1A, the FinFET structure 10 includes a substrate 100, dielectric isolation regions 112, the fin structure 120, and a gate structure 132.

Figure 8A:
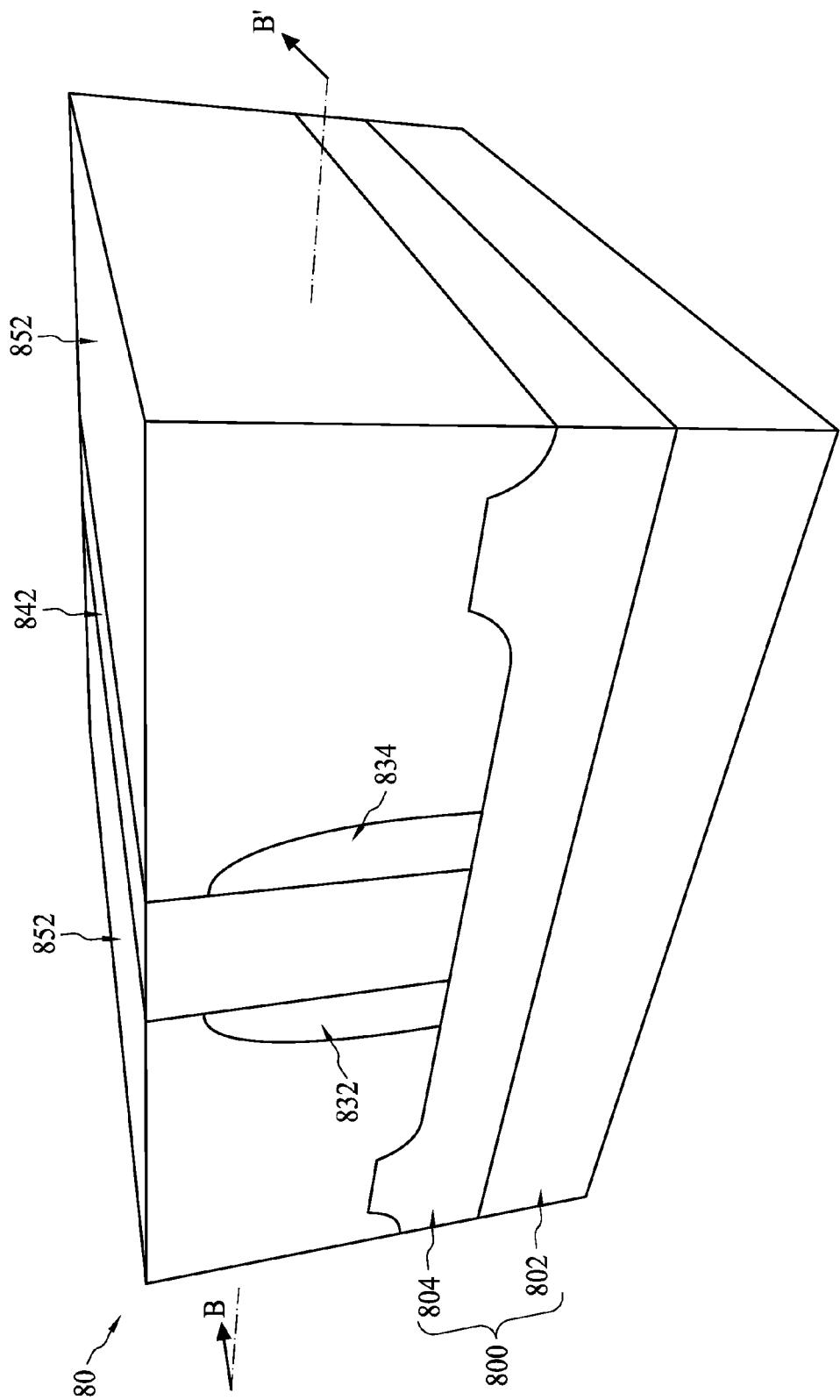
FIG. 8A is a schematic perspective diagram of a nanowire FET structure with a heterostructure channel region in accordance with some embodiments.

In some embodiments, the substrate 100 is a bulk semiconductor substrate made of an elementary material such as silicon. In other embodiments, the substrate 100 is a bulk semiconductor substrate made of a compound material such as gallium arsenide. The substrate 800 made with other elementary semiconductor materials, compound semiconductor materials or alloy semiconductor materials are within the contemplated scope of the present disclosure. In some embodiments, a semiconductor-on-insulator (SOI) substrate as illustratively shown in FIG. 8A is used instead of the bulk semiconductor substrate. In some embodiments, the substrate 100 has a top surface 100A (labeled at the level of the top surface).

In some embodiments, the dielectric isolation regions 112 such as shallow trench isolations (STIs) are formed on the top surface 100A of the substrate 100. Adjacent side walls of trenches in which a dielectric material is filled form the fin structure 120. In some embodiments, dielectric isolation regions 112 are further etched to a level of top surfaces 112A of the dielectric isolation regions 112 so that the fin structure 120 has an exposed portion beyond the top surfaces 112A. In some embodiments, the dielectric isolation regions 114 includes silicon oxide, silicon nitride, silicon oxy-nitride, fluoride-doped silicate (FSG), and/or a suitable low-k dielectric material.

In some embodiments, the fin structure 120 protrudes from the surface 100A of the substrate 100. In some embodiments, the fin structure 120 includes a heterostructure of the barrier section 104 between the high mobility sections 122 and 124, and a region 102 beneath the heterostructure. In some embodiments, the heterostructure forms the portion of the fin structure 120 extended beyond the top surfaces 112A of the dielectric isolation regions 112. The portion of the fin structure 120 extended beyond the top surfaces 112A of the dielectric isolation regions 112 includes the channel region 152 (labeled in FIG. 1B) wrapped around by the gate structure 132. The heterojunctions between the high mobility section 122 and the barrier section 104, and the high mobility section 124 and the barrier section 104 are within the channel region 152.

In some embodiments, the high mobility sections 122 and 124 extend beyond the channel region 152 to form the source region 154 and the drain region 156 (labeled in FIG. 1B), respectively. In some embodiments, for the p-type channel region 152, the portions of the high mobility sections 122 and 124 in the source and drain regions 154 and 156, respectively, are doped with p-type dopants such as boron. In other embodiments, for the n-type channel region 152, the portions of the high mobility sections 122 and 124 in the source and drain regions 154 and 156, respectively, are doped with n-type dopants such as phosphorous and arsenic.

In some embodiments, the gate structure 132 that straddles the fin structure 120 includes a gate dielectric layer and a gate electrode which are not shown in detail so that the channel region 152 wrapped around by the gate structure 132 is more clearly seen. In some embodiments, the gate dielectric layer includes one or more dielectric layers wrapping around the channel region 152 in a conformal manner. In other embodiments, the gate dielectric layer also form the side walls of the gate structure 132. In some embodiments, the gate dielectric layer includes a high-k dielectric material such as $HfO_2$, $HfErO$, $HfLaO$, $HfYO$, $HfGdO$, $HfAlO$, $HfZrO$, $HfTiO$, $HfTaO$, $ZrO_2$, $Y_2O_3$, $La_2O_5$, $Gd_2O_5$, $TiO_2$, $Ta_2O_5$, $SrTiO$, or combinations thereof. The gate electrode caps over the gate dielectric layer. In some embodiments, the gate electrode includes work function metal layers which are conformally formed over the gate dielectric layer for adjusting a threshold voltage of the transistor, and a fill metal that caps over the work function metal layers for serving as the main conductive portion of the gate electrode. Examples of work function metal layers include TaC, TaN, TiN, TaAlN, TaSiN, and combinations thereof. Examples of fill metal includes W, Al, Cu, and combinations thereof.

In some embodiments, to enhance the mobility of the channel region 152, a material with a higher mobility than that of the region 102 is used to form the high mobility sections 122 and 124. In some embodiments, the region 102 is formed of silicon. Because germanium has a higher hole mobility than silicon, the p type channel region 152 with the high mobility sections 122 and 124 formed of germanium or silicon germanium alloy has a higher hole mobility than the channel region 152 formed of the same material as the region 102. In other embodiments, the region 102 is formed of gallium arsenide. Because indium arsenide has a higher electron mobility than gallium arsenide, the n type channel region 152 with the high mobility section 122 and 124 formed of indium arsenide or indium gallium arsenide alloy has a higher electron mobility than the channel region 152 formed of the same material as the region 102.

In some embodiments, to enhance the mobility of the channel region 152, a material with a lattice constant different from that of the region 102 is used to form the high mobility sections 122 and 124. In some embodiments, for the p-type channel region 152, compressive strain is applied to the high mobility sections 122 and 124 to enhance the mobility of the channel region 152. In some embodiments, the region 102 is formed of silicon. Because germanium has a larger lattice constant than silicon, the p type channel region 152 with the high mobility sections 122 and 124 formed of germanium or silicon germanium alloy is compressively strained by the underlying region 102. In other embodiments, the region 102 is formed of gallium arsenide. Because gallium antimonide has a larger lattice constant than gallium arsenide, the p type channel region 152 with the high mobility sections 122 and 124 formed of gallium antimonide or gallium arsenide antimonide alloy is compressively strained by the underlying region 102. In some embodiments, for the n-type channel region 152, tensile strain is applied to the high mobility sections 122 and 124 to enhance the mobility of the channel region 152. In some embodiments, the region 102 and the substrate 100 is formed of a layer of relaxed silicon germanium alloy on bulk silicon. Because silicon has a smaller lattice constant than germanium, the n type channel region 152 with the high mobility sections 122 and 124 formed of silicon or silicon germanium alloy with a smaller atomic percentage of germanium than that of the region 102 is tensily strained by the underlying region 102.

By forming the heterostructure in the channel region 152, the mobility of the channel region 152 is enhanced by using the higher mobility material for the high mobility sections 122 and 124, and/or by using the material with a different lattice constant for the high mobility sections 122 and 124 so that the high mobility sections 122 and 124 are strained by the underlying region 102. However, accompanying with the advantage in mobility is the reduction in band gap energy of the higher mobility material or the material with the different lattice constant. Therefore, the barrier section 104 made of the same material as the region 102, or a material with a mobility or lattice constant between the high mobility sections 122 or 124 and the region 102 is formed between the high mobility sections 122 and 124 to reduce leakage current as will be described in more detail with references to FIGS. 2A to 3B.

Figure 2A:
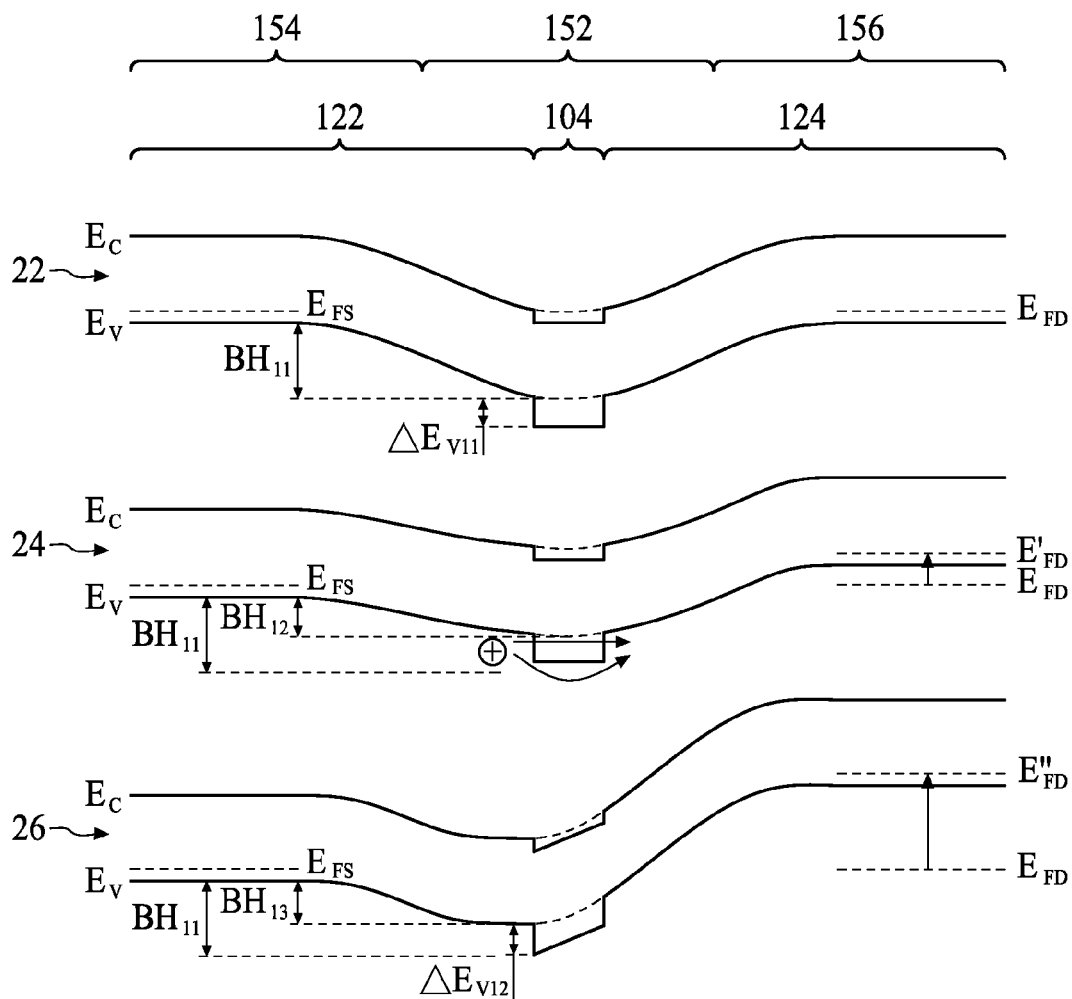
FIG. 2A is a schematic diagram illustrating energy band diagrams of the p-type FinFET structure in FIG. 1A from the source region to the drain region under various gate voltage and drain voltage conditions in accordance with some embodiments.

FIG. 2A is a schematic diagram illustrating energy band diagrams 22, 24 and 26 of the p-type FinFET structure 10 (shown in FIG. 1A) from the source region 154 to the drain region 156 shown in FIG. 1B under various gate voltage and drain voltage conditions in accordance with some embodiments. Each of the energy band diagrams 22, 24 and 26 includes a conduction band $E_C$ and a valence band $E_V$ of the source region 154, the channel region 152 and the drain region 156. Referring to both FIG. 1B and FIG. 2A, from the source region 154 to the drain region 156, the sections encountered are the p-doped high mobility section 122 in the source region 154, the n-doped or undoped high mobility section 122, barrier section 104 and high mobility section 124 in the channel region 152, and the p-doped high mobility section 124 in the drain region 156. In some embodiments, the barrier section 104 is formed of silicon or silicon germanium alloy ($Si_{1-x}Ge_x$), and the high mobility sections 122 and 124 are formed of germanium or silicon germanium alloy ($Si_{1-y}Ge_y$), where $0 \leq x < y \leq 1$. Under this condition of the Ge atomic percentages, the barrier section 104 has a positive valence band offset such as $\Delta E_{V11}$ with respect to each of the high mobility sections 122 and 124. In other words, for holes as carriers, the barrier section 104 has a larger valence band energy than the high mobility section 122 or 124.

The energy band diagram 22 corresponds to the condition of a high gate voltage, a high drain voltage, and a high source voltage. The terms "high" and "low" used herein are relative and refer to voltages equal to, for example, Vdd and 0V, respectively. Under the condition for the energy band diagram 22, the transistor is in the OFF state. Both the source region 154 and the drain region 156 receives the high voltage, which results in the same Fermi level $E_{FS}$ on the side of the source region 154 and Fermi level $E_{FD}$ on the side of the drain region 156. The p-n junction between the source region 154 and the channel region 152 under zero source to gate bias creates a hole energy barrier with a barrier height of $BH_{11}$. The barrier section 104 further increases the hole energy barrier by the valence band offset $\Delta E_{V11}$, and therefore further prevents a leakage current from the source region 154 to the drain region 156.

The energy band diagram 24 corresponds to the condition of a low gate voltage, a drain voltage lower than the high drain voltage, and the high source voltage. Under the condition for the energy band diagram 24, the transistor is in the ON state. The drain region 156 receives the voltage lower than the high drain voltage, which results in the Fermi level $E_{FD}$ to be lowered to a Fermi level $E'_{FD}$ by an amount of the voltage reduced. With respect to holes, the Fermi level $E_{FD}$ is higher than the Fermi level $E'_{FD}$. The barrier height $BH_{11}$ created by the p-n junction between the source region 154 and the channel region 152 is lowered to a barrier height $BH_{12}$ by the applied gate to source voltage. Although the barrier section 104 further increases the hole energy barrier, a thickness of the barrier section 104 is less than a gate length of the gate structure 132 (shown in FIG. 1B), and the positive valence band offset is between silicon or silicon germanium alloy of lower atomic percentage of germanium, and germanium or silicon germanium alloy of higher atomic percentage of germanium. Therefore, holes can tunnel through the hole energy barrier via quantum tunneling or leaps over the hole energy barrier via hot carrier injection.

The energy band diagram 26 corresponds to the condition of a high gate voltage, a low drain voltage, and a high source voltage. Under the condition for the energy band diagram 26, the transistor is in the OFF state. The drain region 156 receives the low drain voltage, which results in the Fermi level $E_{FD}$ to be lowered to a Fermi level $E''_{FD}$ by an amount of the voltage reduced. The p-n junction between the source region 154 and the channel region 152 under zero source to gate bias should create the hole energy barrier with the barrier height of $BH_{11}$. However, because of the small gate length, the low drain voltage induces lowering of the hole energy barrier to the barrier height $BH_{13}$, a phenomenon known as drain induced barrier lowering (DIBL). Such lowering of the barrier height can increase the leakage current from the source region 154 to the drain region 156. The positive valence band offset $\Delta E_{V12}$ introduced by the barrier section 104 compensates for the lowering of the barrier height, thereby reducing the leakage current.

The energy bands of the high mobility section 122 or 124 and the barrier section 104 are subjected to band bending at the interface of the heterostructure to establish equilibrium. For simplicity, the band bending effect is not illustrated in the energy band diagrams 22, 24 and 26. The shape of the energy band diagrams 22, 24 and 26 as well as the band offsets subjected to the band bending effect are within the contemplated scope of the present disclosure. In addition, in the embodiments in FIG. 2A, the heterostructure of $Si_{1-x}Ge_x$ and $Si_{1-y}Ge_y$ has a staggered type (type II) junction. Other types of junction, such as a straddling type (type I) junction formed by $GaAs_{1-x}Sb_x$ and $GaAs_{1-y}Sb_y$, are within the contemplated scope of the present disclosure.

Figure 2B:
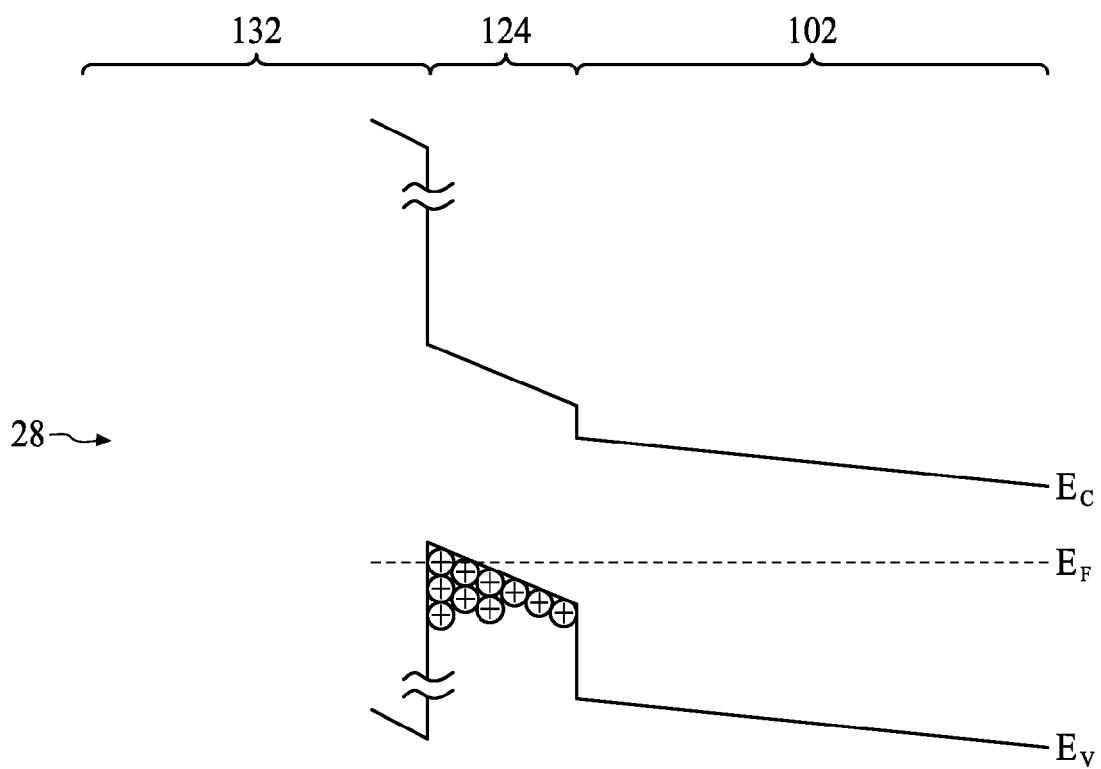
FIG. 2B is a schematic diagram illustrating an energy band diagram of the p-type FinFET structure in FIG. 1A from the gate structure to the region in the fin structure in accordance with some embodiments.

FIG. 2B is a schematic diagram illustrating an energy band diagram 28 of the p-type FinFET structure 10 (shown in FIG. 1A) from the gate structure 132 to the region 102 shown in FIG. 1B in accordance with some embodiments. Referring to both FIG. 1B and FIG. 2B, the energy band diagram includes a conduction band $E_C$ and a valence band $E_V$ of a gate dielectric portion of the gate structure 132, the high mobility section 124 in the channel region 152, and the region 102. In some embodiments, the high mobility section 124 is formed of germanium or silicon germanium alloy ($Si_{1-y}Ge_y$), and the region 102 is formed of silicon or silicon germanium alloy ($Si_{1-x}Ge_x$), where $0 \leq x < y \leq 1$. The gate dielectric portion of the gate structure 132 includes an insulating material and therefore has a large band gap. When the gate voltage is lowered, the energy bands (not shown) on the side of the gate structure 132 is raised, causing the energy bands of the gate dielectric portion to tilt upwards toward the side of the gate structure 132, and the valence band $E_V$ of the high mobility section 124 to bend upwards toward the interface of the gate dielectric portion and the high mobility section 124. When the gate voltage is low enough, the valence band $E_V$ of the high mobility section 124 will be bent close enough to the Fermi level $E_F$ and cause an inversion layer of holes. Further, the region 102 has a positive valence band offset from the high mobility section 124 so that the inversion layer of holes are confined in a quantum well, thereby increasing density of the holes in the channel region 152.

Figure 3A:
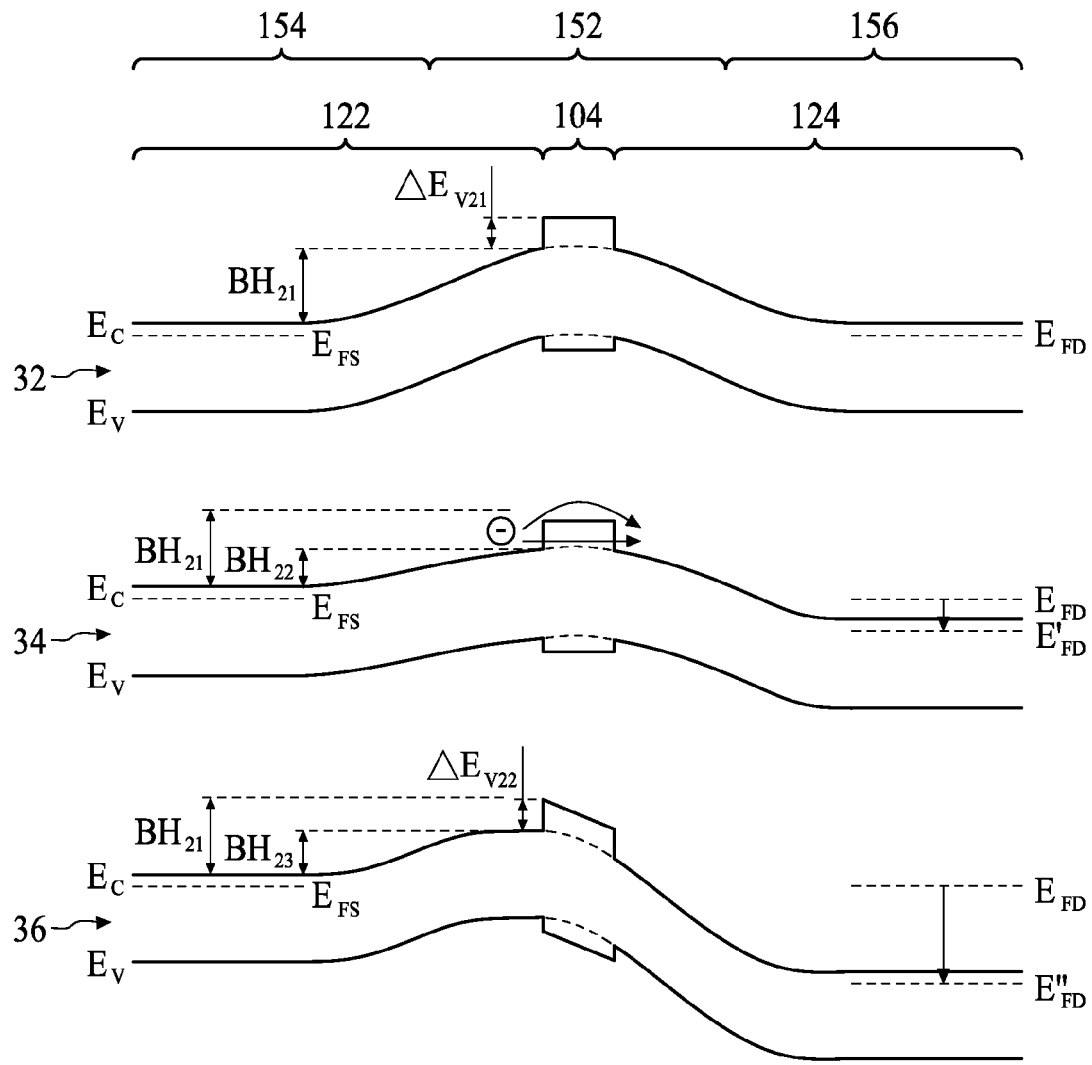
FIG. 3A is a schematic diagram illustrating energy band diagrams of the n-type FinFET structure in FIG. 1A from the source region to the drain region under various gate voltage and drain voltage conditions in accordance with some embodiments.

FIG. 3A is a schematic diagram illustrating energy band diagrams 32, 34 and 36 of the n-type FinFET structure 10 (shown in FIG. 1A) from the source region 154 to the drain region 156 shown in FIG. 1B under various gate voltage and drain voltage conditions in accordance with some embodiments. Compared to the embodiments described with reference to FIG. 2A, from the source region 154 to the drain region 156 labeled in both FIGS. 1B and 3A, the sections encountered are the n-doped high mobility section 122 in the source region 154, the p-doped or undoped high mobility section 122, barrier section 104 and high mobility section 124 in the channel region 152, and the n-doped high mobility section 124 in the drain region 156. In some embodiments, the barrier section 104 is formed of germanium or silicon germanium alloy ($Si_xGe_{1-x}$), and the high mobility sections 122 and 124 are formed of silicon or silicon germanium alloy ($Si_yGe_{1-y}$), where for the n-type channel region 152, $0 \le x < y \le 1$. Under this condition of the Ge atomic percentages, the barrier section 104 has a positive conduction band offset such as $\Delta E_{V21}$ with respect to each of the high mobility sections 122 and 124. In other words, for electrons as carriers, the barrier section 104 has a larger conduction band energy than the high mobility section 122 or 124.

The energy band diagram 32 corresponds to the condition of a low gate voltage, a low drain voltage, and a low source voltage. Under the condition for the energy band diagram 32, the transistor is in the OFF state. Both the source region 154 and the drain region 156 receives the low voltage, which results in the same Fermi level $E_{FS}$ on the side of the source region 154 and Fermi level $E_{FD}$ on the side of the drain region 156. The p-n junction between the source region 154 and the channel region 152 under zero source to gate bias creates an electron energy barrier with a barrier height of $BH_{21}$. The barrier section 104 further increases the hole energy barrier by the conduction band offset $\Delta E_{V21}$, and therefore further prevents a leakage current from the source region 154 to the drain region 156.

The energy band diagram 34 corresponds to the condition of a high gate voltage, a drain voltage higher than the low drain voltage, and the low source voltage. Under the condition for the energy band diagram 34, the transistor is in the ON state. The drain region 156 receives the voltage higher than the low drain voltage, which results in the Fermi level $E_{FD}$ to be lowered to a Fermi level $E'_{FD}$ by an amount of the voltage increased. With respect to electrons, the Fermi level $E_{FD}$ is higher than the Fermi level $E'_{FD}$. The barrier height $BH_{21}$ created by the p-n junction between the source region 154 and the channel region 152 is lowered to a barrier height $BH_{22}$ by the applied gate to source voltage. Further, although the barrier section 104 further increases the electron energy barrier, electrons can tunnel through the electron energy barrier via quantum tunneling or leaps over the hole energy barrier via hot carrier injection.

The energy band diagram 36 corresponds to the condition of a low gate voltage, a high drain voltage, and a low source voltage. Under the condition for the energy band diagram 36, the transistor is in the OFF state. The drain region 156 receives the high drain voltage, which results in the Fermi level $E_{FD}$ to be lowered to a Fermi level $E''_{FD}$ by an amount of the voltage increased. The p-n junction between the source region 154 and the channel region 152 under zero gate to source bias should create the electron energy barrier with the barrier height of $BH_{21}$. However, because of the small gate length, the low drain voltage induces lowering of the electron energy barrier to the barrier height $BH_{23}$. Such lowering of the barrier height can increase the leakage current from the source region 154 to the drain region 156. The positive conduction band offset $\Delta E_{V22}$ introduced by the barrier section 104 compensates for the lowering of the barrier height, thereby reducing the leakage current.

The energy bands of the high mobility section 122 or 124 and the barrier section 104 are subjected to band bending at the interface of the heterostructure to establish equilibrium. For simplicity, the band bending effect is not illustrated in the energy band diagrams 32, 34 and 36. The shape of the energy band diagrams 32, 34 and 36 as well as the band offsets subjected to the band bending effect are within the contemplated scope of the present disclosure. In addition, in the embodiments in FIG. 3A, the heterostructure of $Si_xGe_{1-x}$ and $Si_yGe_{1-y}$ has a staggered type (type II) junction. Other types of junction, such as a straddling type (type I) junction formed by $In_xGa_{1-x}As$ and $In_yGa_{1-y}As$, are within the contemplated scope of the present disclosure.

Figure 3B:
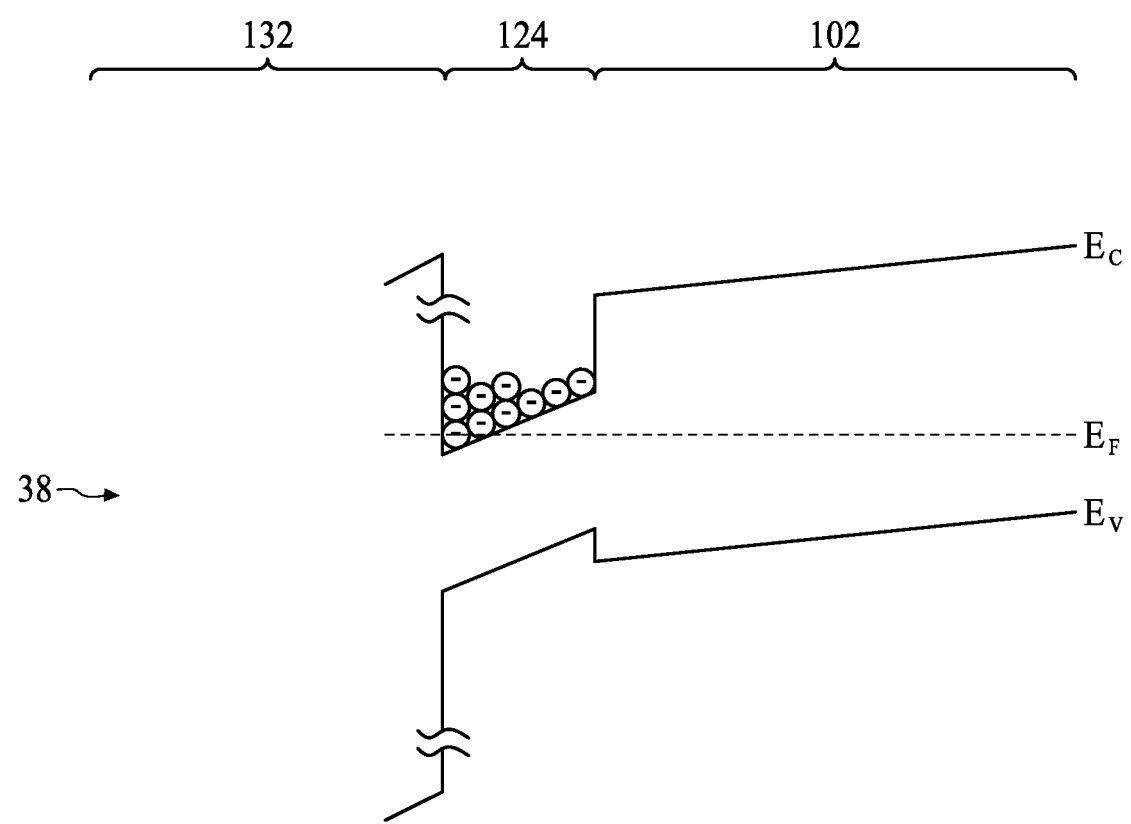
FIG. 3B is a schematic diagram illustrating an energy band diagram of the n-type FinFET structure in FIG. 1A from the gate structure to the region in the fin structure in accordance with some embodiments.

FIG. 3B is a schematic diagram illustrating an energy band diagram 38 of the n-type FinFET structure 10 (shown in FIG. 1A) from the gate structure 132 to the region 102 shown in FIG. 1B in accordance with some embodiments. Referring to both FIG. 1B and FIG. 3B, the energy band diagram includes a conduction band $E_C$ and a valence band $E_V$ of a gate dielectric portion of the gate structure 132, the high mobility section 124 in the channel region 152, and the region 102. In some embodiments, the high mobility section 124 is formed of silicon or silicon germanium alloy ($Si_yGe_{1-y}$), and the region 102 is formed of germanium or silicon germanium alloy ($Si_xGe_{1-x}$), where $0 \le x < y \le 1$. When the gate voltage is increased high enough, the inversion layer of electrons will be formed and will be confined in a quantum well due to the positive conduction band offset introduced by the region 102, thereby increasing density of the electrons in the channel region 152.

Figure 4:
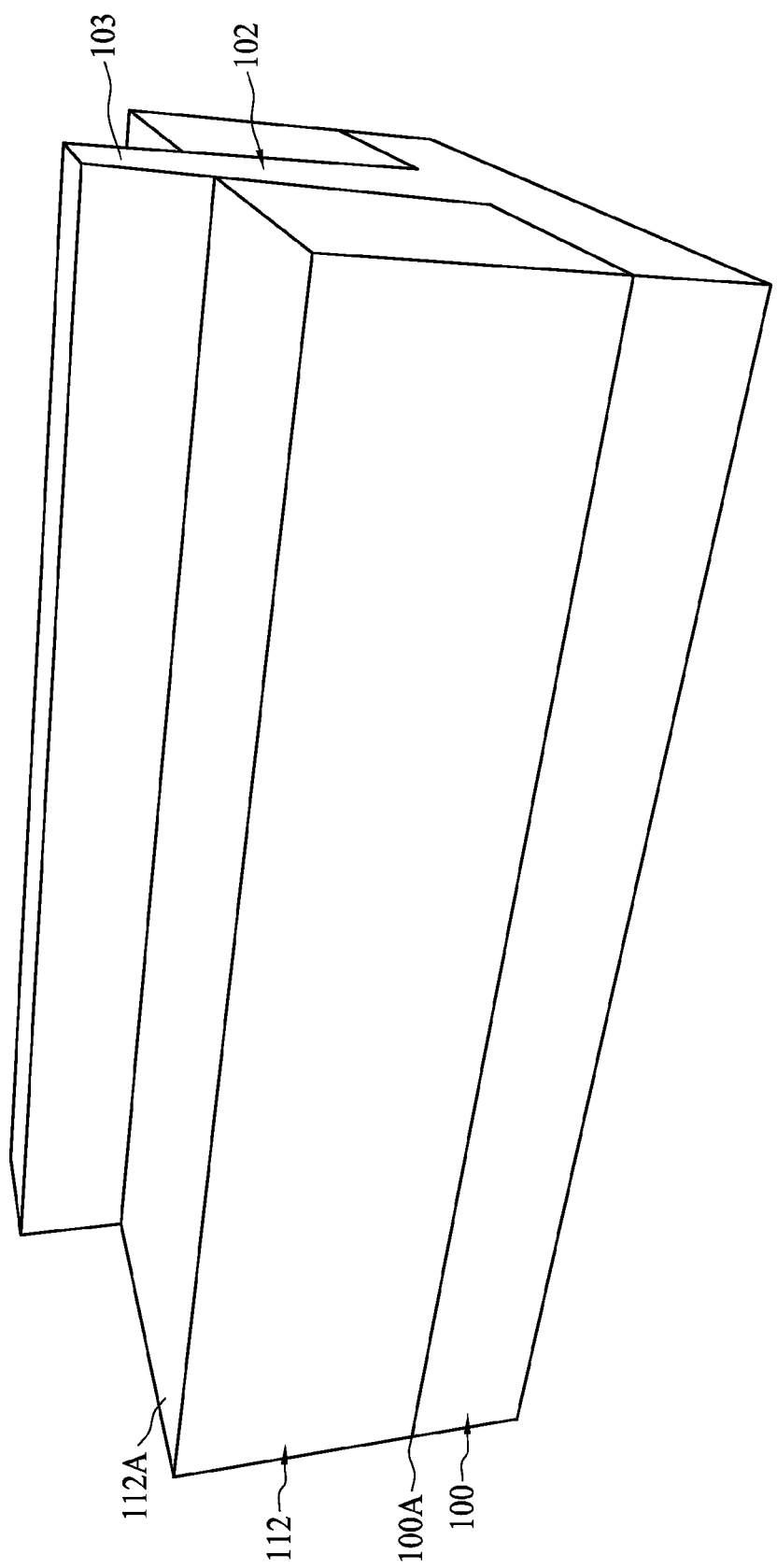
FIGS. 4 to 7 are schematic perspective diagrams of semiconductor structures formed by operations in a fabrication process of the FinFET structure in FIG. 1A in accordance with some embodiments.

FIGS. 4 to 7 are schematic perspective diagrams of semiconductor structures formed by operations in a fabrication process of the FinFET structure 10 in FIG. 1A in accordance with some embodiments. Referring to FIG. 4, a fin structure 102 protruding from a top surface 100A of a substrate 100 is formed. In some embodiments, the fin structure 102 is formed by etching trenches in a bulk semiconductor substrate. The top surface 100A of the substrate is located at a level of the bottom surfaces of the trenches. Between the trenches is the fin structure 102 extending from the top surface 100A of the substrate 100. Further, the trenches are filled with a dielectric material as described with reference to FIG. 1A to form the dielectric isolation regions 112. In some embodiments, the dielectric isolation regions 112 are further etched so that a layer 103 of the fin structure 102 beyond the top surfaces 112A of the dielectric isolation regions 112 is exposed from the dielectric isolation regions 112.

Figures 1, 5:
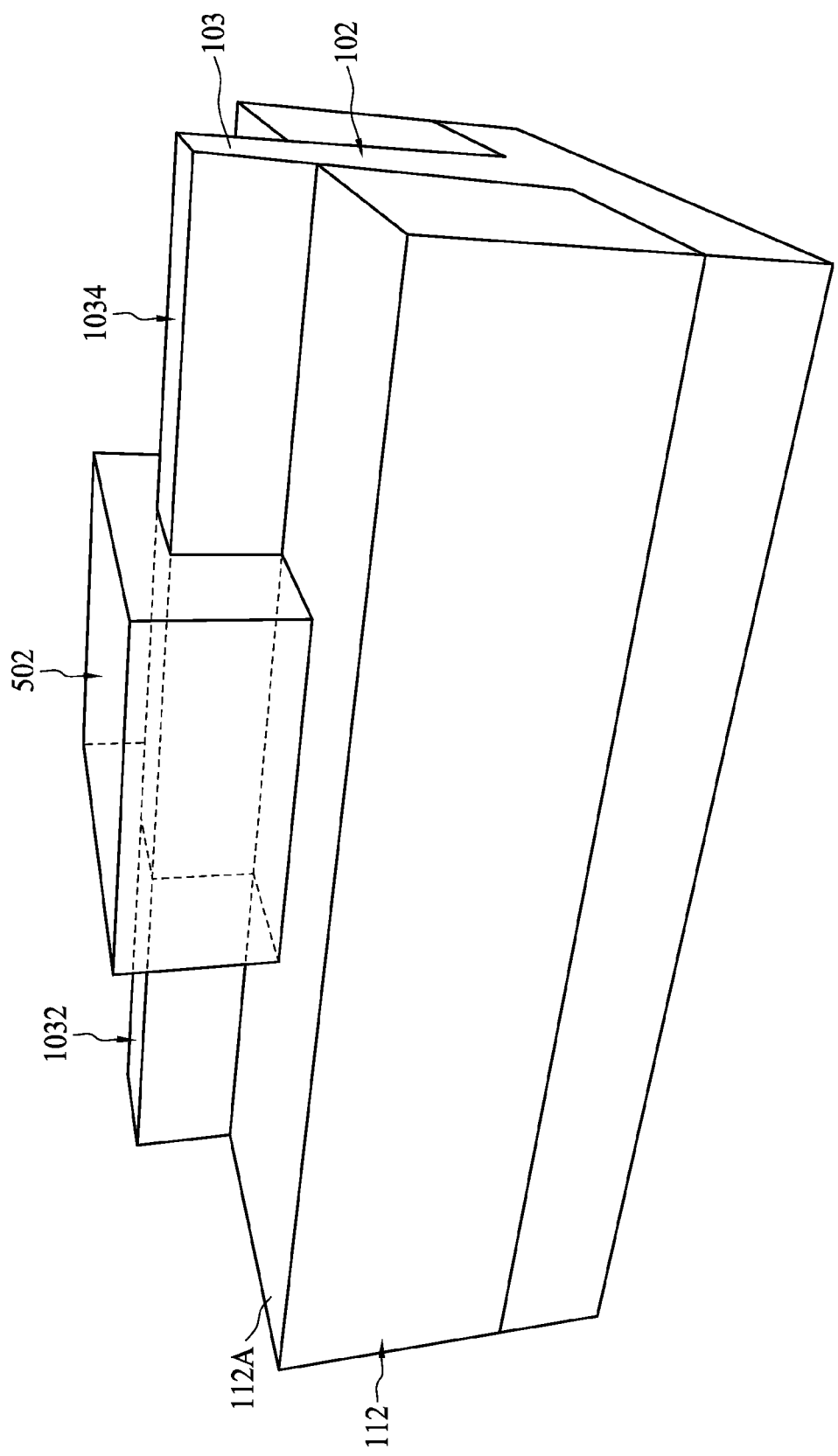

Referring to FIG. 5-1, a hard mask 502 is formed on the layer 103 of the fin structure 102. In some embodiments, in order to form the hard mask 402, one or more hard mask layers are blanket deposited over the surfaces 112A of the dielectric isolation regions 112 and the layer 103 of the fin structure 102, and a photoresist layer is formed on the one or more hard mask layers. In some embodiments, one or more hard mask layers include. The one or more hard mask layers and the photoresist layer can be deposited using any of the methods such as physical vapor deposition (PVD), chemical vapor deposition (CVD), atomic layer deposition (ALD), or other suitable methods. The photomask for forming the gate structure 132 illustrated in FIG. 1A is used to pattern the photoresist layer into a photoresist mask which defines an area where the hard mask 502 is located. The pattern of the photoresist mask is then transferred to the one or more hard mask layers to form the hard mask 502. The transferring of the pattern from the photoresist mask to the hard mask 502 is performed using, for example, anisotropic dry etching.

Figures 2, 5:
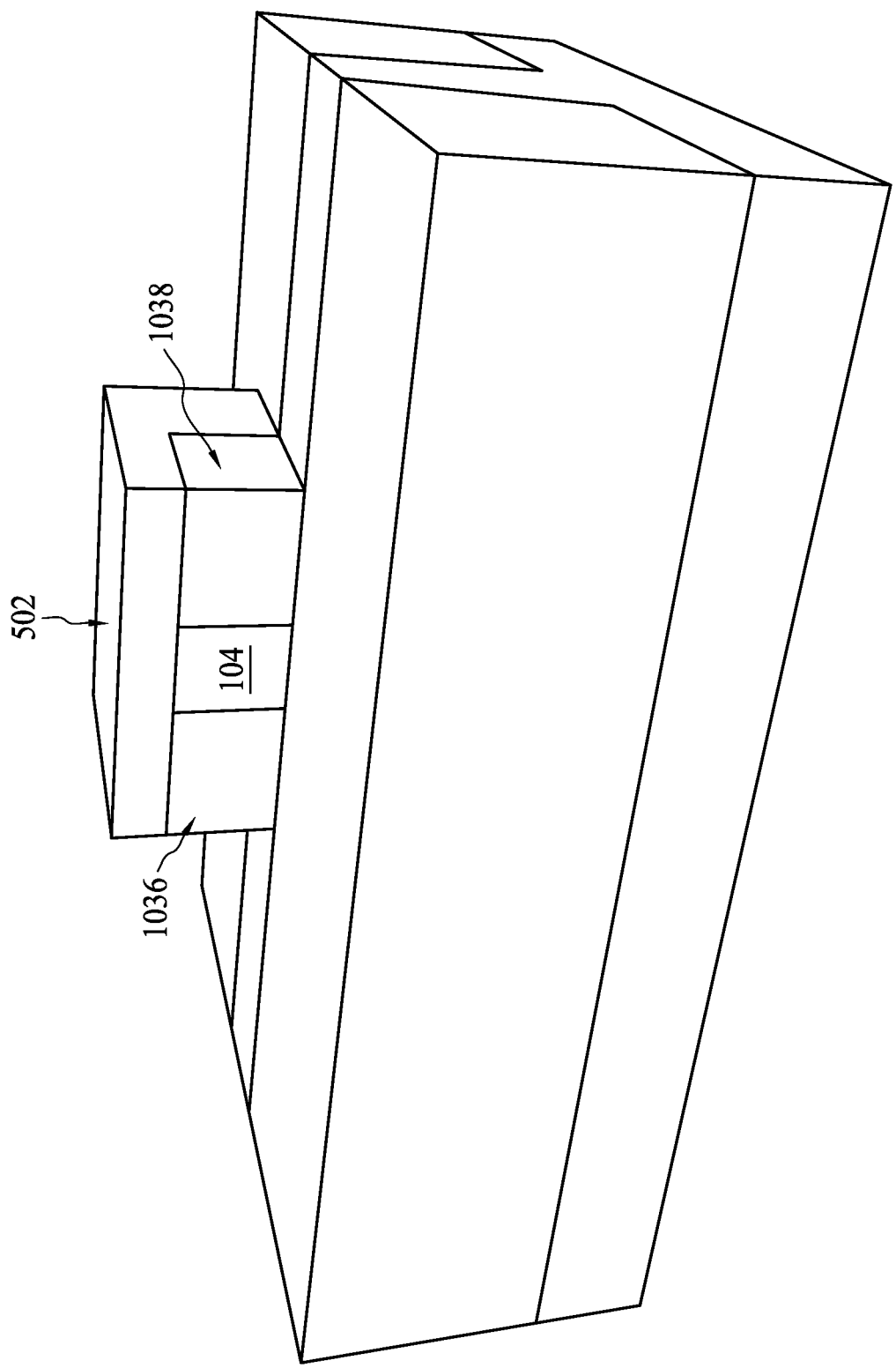

Referring to FIG. 5-2, sections 1032 and 1034 in the layer 103 shown in FIG. 5-1 are removed, and sections 1036 and 1038 in the layer 103 are converted into selective etchable portions with respect to the barrier section 104. The portion of the hard mask 502 that covers the front of the sections 1036, 104 and 1038 is not drawn so that the sections 1036, 104 and 1038 can be labeled. In some embodiments, the sections 1032 and 1034 in the layer 103 are removed using, for example, anisotropic dry etching. In order to convert the sections 1036 and 1038 in the layer 103 into selective etchable portions with respect to the barrier section 104, the sections 1036 and 1038 are thermally oxidized in accordance with some embodiments. Take the fin structure 102 formed of silicon as an example, the sections 1036 and 1038 are converted into silicon oxide. For simplicity, oxidation of other portions of the fin structure such as the surface of the fin structure 102 exposed after the removal of the sections 1032 and 1034 is not illustrated.

Figures 3, 5:
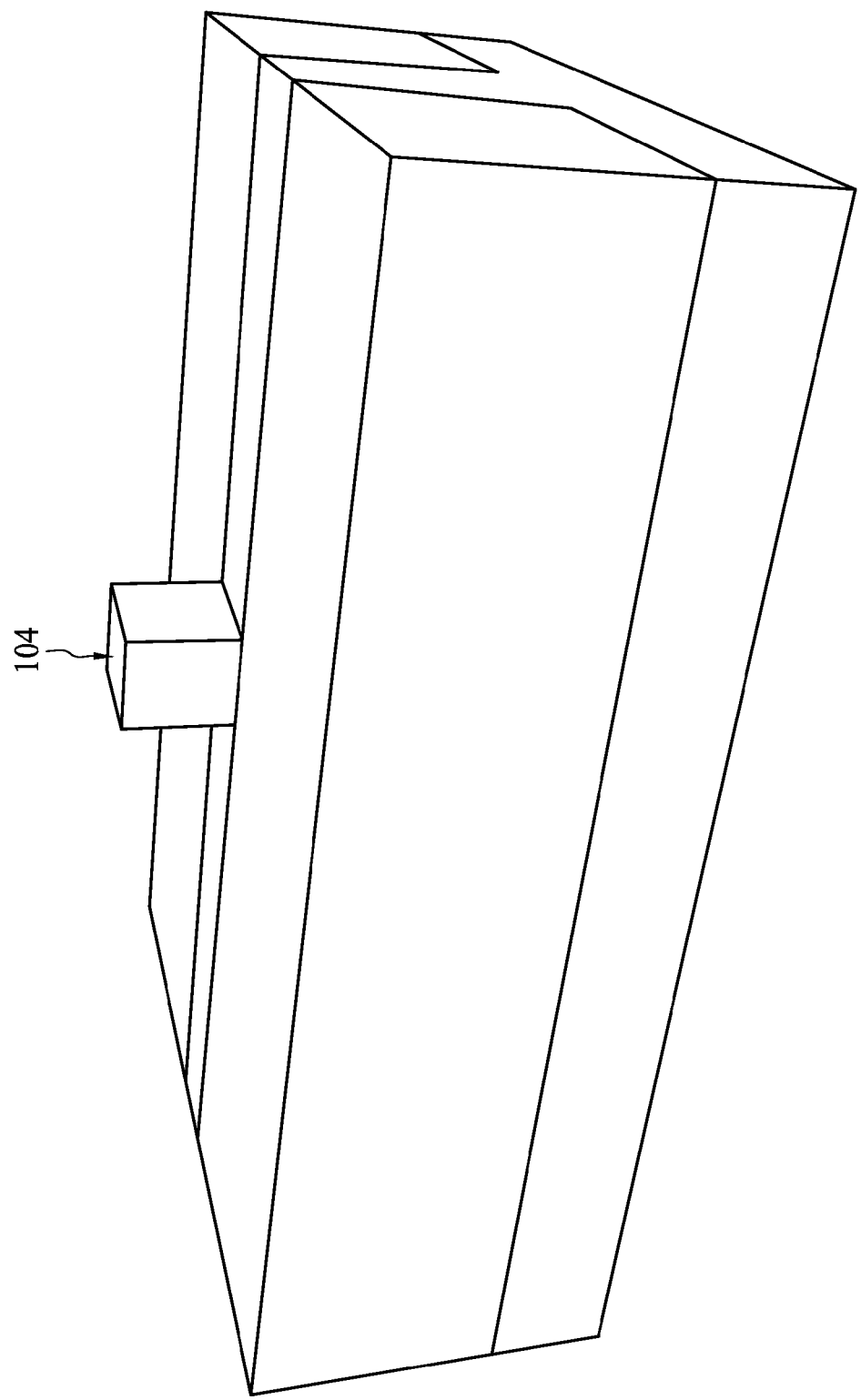

Referring to FIG. 5-3, sections 1036 and 1038 show in FIG. 5-2 are removed such that the barrier section 104 between the sections 1036 and 1038 remains. In some embodiments, sections 1036 and 1036 are removed using, for example, isotropic wet etching of silicon oxide. Due to etching selectivity between silicon oxide and silicon, the barrier section 104 remains. Then, the hard mask 502 is removed using a proper etching technique.

Figure 6:
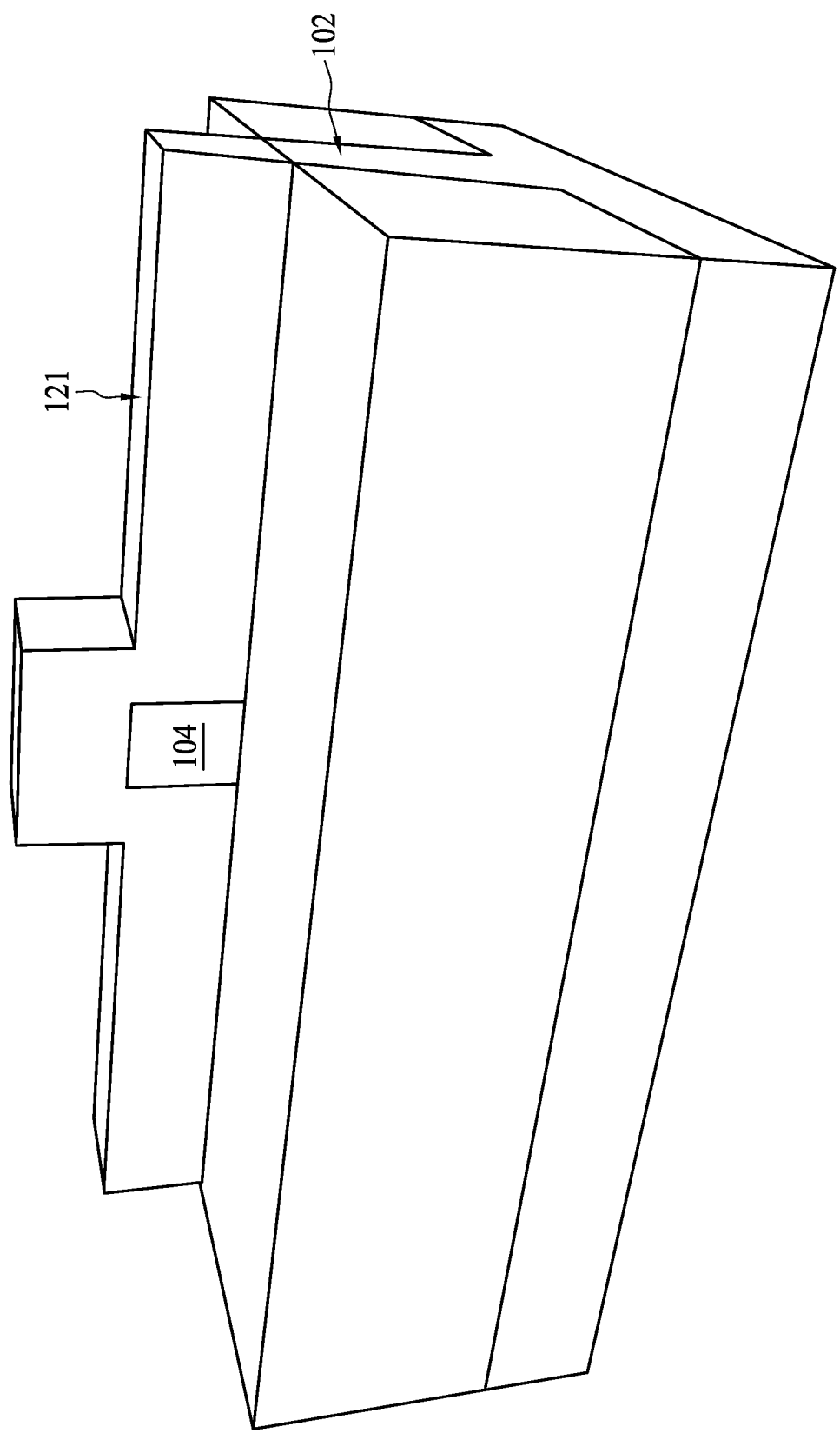

Referring to FIG. 6, an epitaxial layer 121 of a high mobility material is grown on surfaces of the remaining fin structure 102 on opposite sides of the barrier section 104 and surfaces of the barrier section 104. In some embodiments, a high mobility material such as $Si_{1-x}Ge_x$ is selectively formed on the fin structure 102 and the barrier section 104 using a selective epitaxial deposition process.

Figure 7:
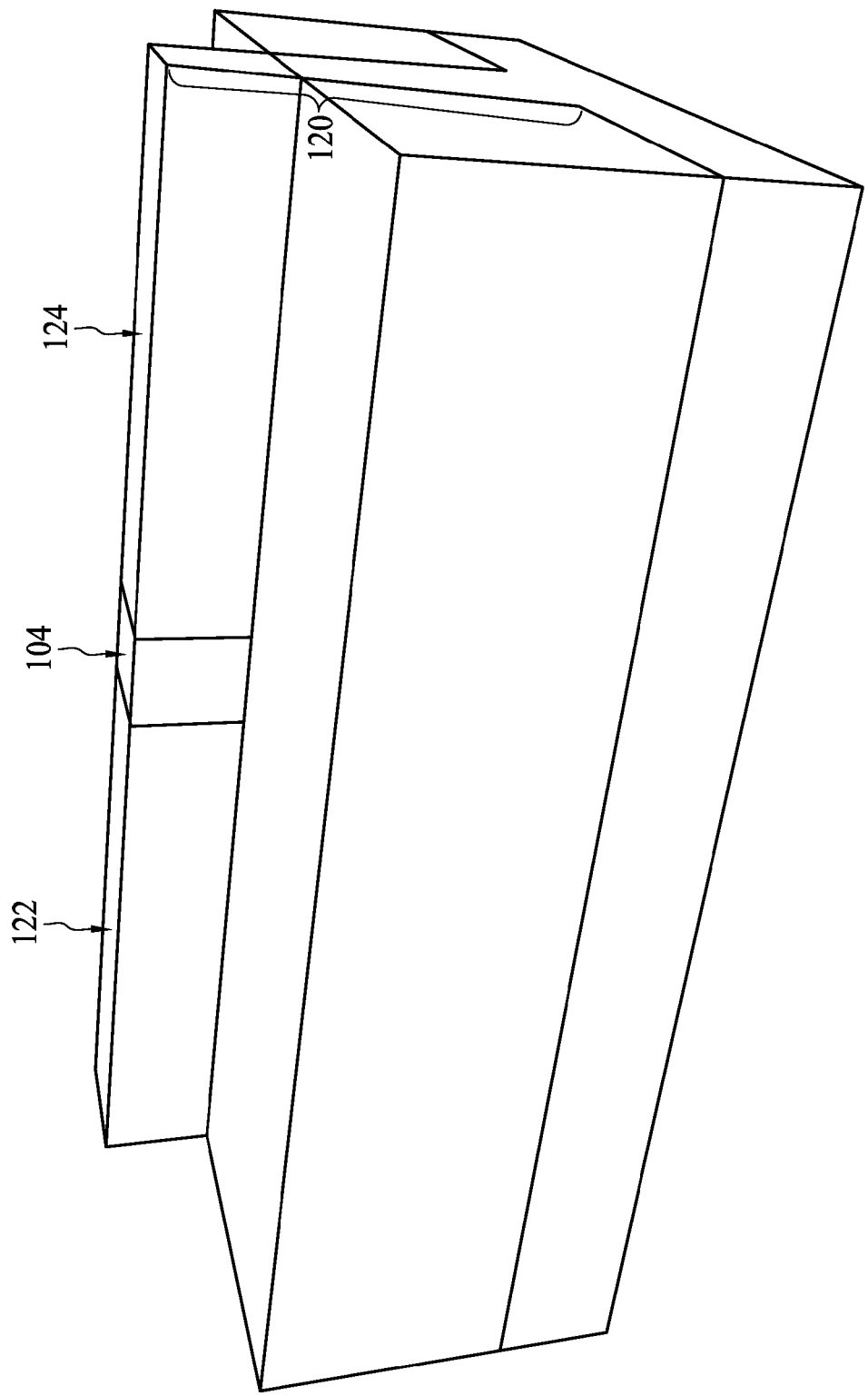

Referring to FIG. 7, the epitaxial layer 121 shown in FIG. 6 is planarized so as to form the high mobility sections 122 and 124. In some embodiments, the epitaxial layer 121 is planarized using, for example, chemical mechanical polishing (CMP), until the epitaxial layer 121 is planar the barrier section 104 and therefore forms a fin structure 120 with a heterostructure that includes the high mobility sections 122 and 124 separated by the barrier section 104.

Referring to FIG. 1A, a gate structure 132 straddling the fin structure 120 is formed. In some embodiments, the gate structure 132 is formed by a replacement gate process. A sacrificial gate structure straddling the fin structure 120 is formed first. The pattern of the sacrificial gate structure is formed using the photomask which is also used to form the barrier section 104, as described with references to FIGS. 5-1 to 5-3. In some embodiments, a sidewall spacer surrounding the sacrificial gate structure is formed. After subsequent processing of the fin structure 120 such as implanting dopants into source and drain regions 154 and 156 (labeled in FIG. 1B) of the fin structure 120, an interlayer dielectric (ILD) layer is formed over the fin structure 120 and the surface 112A, and the sacrificial gate structure is removed and replaced by the gate structure 132 with the gate dielectric layer and the gate electrode as described with reference to FIG. 1A. In other embodiments, the gate structure 132 is formed by a non-replacement gate process. Layers, such as the gate dielectric layer and the layers for the gate electrode are formed over the fin structure 120 and the surface 112A. The layers are then patterned into the gate structure 132 using the photomask which is also used to form the barrier section 104, as described with references to FIGS. 5-1 to 5-3.

Figure 8B:
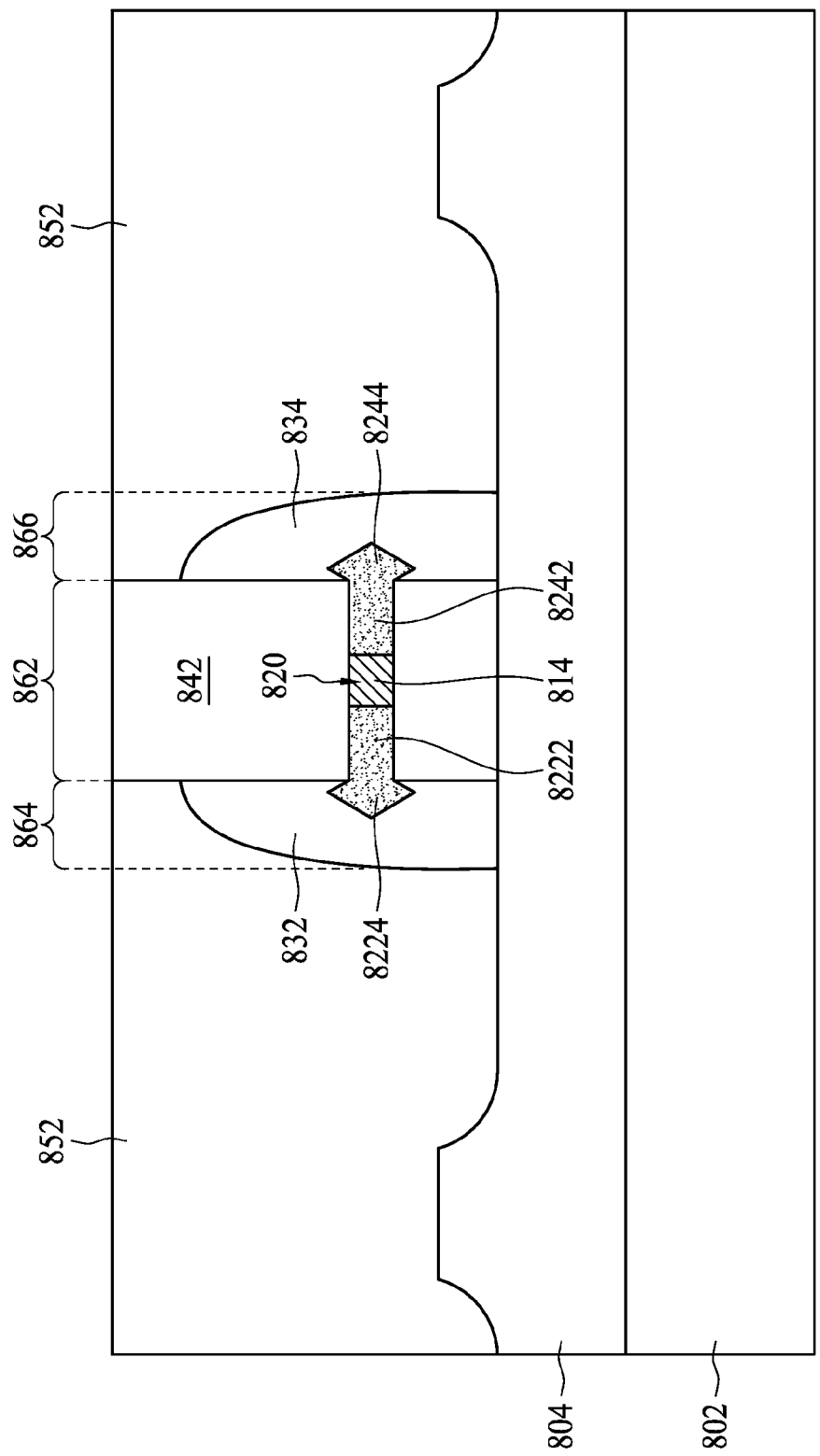
FIG. 8B is a cross sectional diagram along line B-B' in FIG. 8A in accordance with some embodiments.

FIG. 8A is a schematic perspective diagram of a nanowire FET structure 80 with a heterostructure channel region in accordance with some embodiments. FIG. 8B is a cross sectional diagram along line B-B' in FIG. 8A in accordance with some embodiments. FIGS. 8A and 8B illustrate that a nanowire structure 820 includes the heterostructure channel region 862 (labeled in FIG. 8B) formed of portions of high mobility sections 8222 and 8242 separated by a barrier section 814. Referring to FIGS. 8A and 8B, the nanowire FET structure 80 includes a substrate 800, the nanowire structure 820, a gate structure 842, side wall regions 832 and 834, and interlayer dielectric (ILD) layer 852.

In some embodiments, the substrate 800 are portions of a semiconductor-on-insulator (SOI) substrate. The SOI substrate, as illustratively shown in FIG. 9, includes a semiconductor layer 802, an insulator layer 804 on the semiconductor layer 802, and a semiconductor layer 806 on the insulator layer 804. The semiconductor layer 806 is subsequently patterned into the nanowire structures 8124 suspended over the insulator layer 804. In the present disclosure, the semiconductor layer 802 and the insulator layer 804 is referred to as the substrate 800 of the nanowire FET structure 80. In some embodiments, the semiconductor layer 802 is made of silicon, and the insulator layer is a buried oxide (BOX) layer. In some embodiments, the semiconductor layer 806 is made of an elementary material such as silicon, or an alloy material such as silicon germanium. In other embodiments, the semiconductor layer 806 is made of a compound material such as gallium arsenide, or an alloy material such as indium gallium arsenide, or gallium arsenide antimonide. The substrate 800 made with other elementary semiconductor materials, compound semiconductor materials or alloy semiconductor materials are within the contemplated scope of the present disclosure.

In some embodiments, the nanowire structure 820 is suspended over the insulator layer 804. In some embodiments, the nanowire structure 802 includes a heterostructure of the barrier section 814 between the high mobility sections 8222 and 8242, and high mobility section extensions 8224 and 8244 on opposite sides of the heterostructure. In some embodiments, the heterostructure forms the channel region 862 wrapped around by the gate structure 842. The heterojunctions between the high mobility section 8222 and the barrier section 814, and the high mobility section 8242 and the barrier section 814 are within the channel region 862.

Exemplary materials of the high mobility sections 8222 and 8242 and the barrier section 814, and the manner with which the high mobility sections 8222 and 8242 enhancing the mobility of the channel region 862 is similar to that of the FinFET structure 10 described with references to FIGS. 1A and 1B except that the nanowire structure 820 is suspended over the insulator region 804, and therefore the high mobility sections 8222 and 8242 are not strained by an underlying layer. A material of the high mobility section extensions 8224 and 8244 is the same as that of the high mobility sections 822 and 8242. In addition, the manner with which the barrier section 814 reduces a leakage from the source region 864 to the drain region 866 is similar to that described with references to FIG. 2A to 3B and is omitted here.

In some embodiments, the gate structure 842 that wraps around the channel region 862 of the nanowire structure 820 are formed on the insulator layer 804. The gate structure 862 includes a gate dielectric layer and a gate electrode similar to those described with references to FIGS. 1A and 1B.

In some embodiments, the side wall regions 832 and 834 are formed on opposite sides of the gate structure 842 and contact the high mobility section extensions 8224 and 8244, respectively. In some embodiments, the side wall regions 832 and 834 is formed of an amorphous material such as amorphous silicon, amorphous silicon germanium alloy, and the like. Source and drain regions 864 and 866 on opposite sides of the gate structure 842 include the high mobility section extension 8224 and the side wall region 832, and the high mobility section extension 8244 and the side wall region 834, respectively. The source and drain regions 864 and 866 are doped with p-type dopants or n-type dopants depending on the type of the channel region 862.

In some embodiments, the ILD layer 852 is formed on the insulator layer 804 and covers exposed side walls of the gate structure 843 and the side wall regions 834. In some embodiments, the ILD layer 852 includes an oxide material or a low-k dielectric material.

Figure 9:
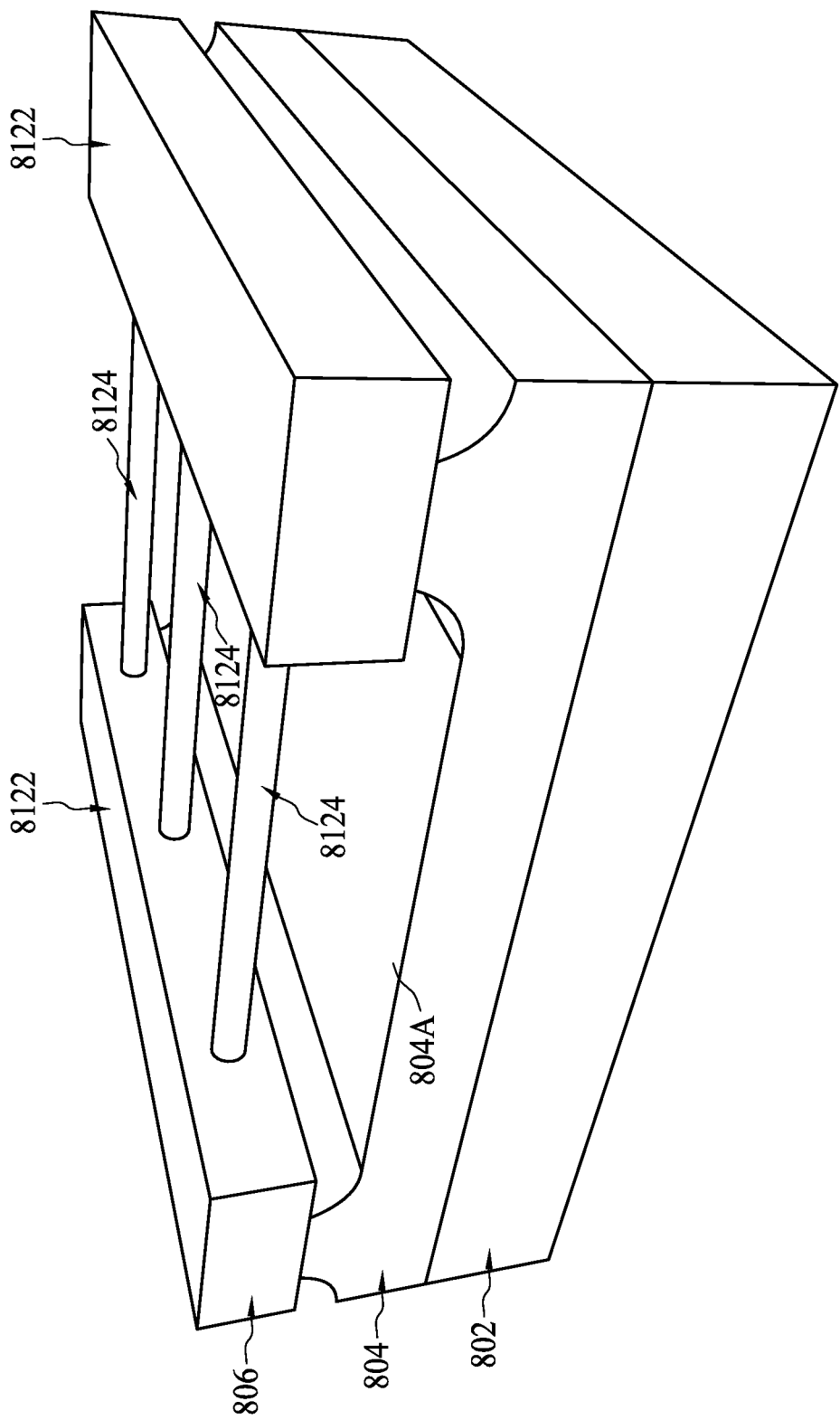

FIGS. 9 and 10A to 14A are schematic perspective diagrams of semiconductor structures formed by operations in a fabrication process of the nanowire FET structure 80 in FIG. 8A in accordance with some embodiments. FIGS. 10B to 14B are cross sectional diagrams along line B-B' in FIGS. 10A to 14A, respectively. Referring to FIG. 9, nanowire structures 8124 is suspended over a surface 804A of the insulator layer 804. In some embodiments, to form the nanowire structure 8124, the semiconductor layer 806 of the SOI substrate is patterned by, for example, a lithographic process and an etching process such as reactive ion etching (RIE) to form nanowire structures 8124 suspended by pad regions 806. Once the pad regions 806 and the nanowire structures 8124 are patterned, an isotropic etching process suspends the nanowire structures 8124 above the insulator layer 804 by removing a portion of the insulator layer 804. In some embodiments, the nanowire structure 8124 is smoothened to have a circular-shaped or an elliptical-shaped cross section. In some embodiments (not shown), the nanowire structure 8124 is thinned by an oxidation process.

Figure 10A:
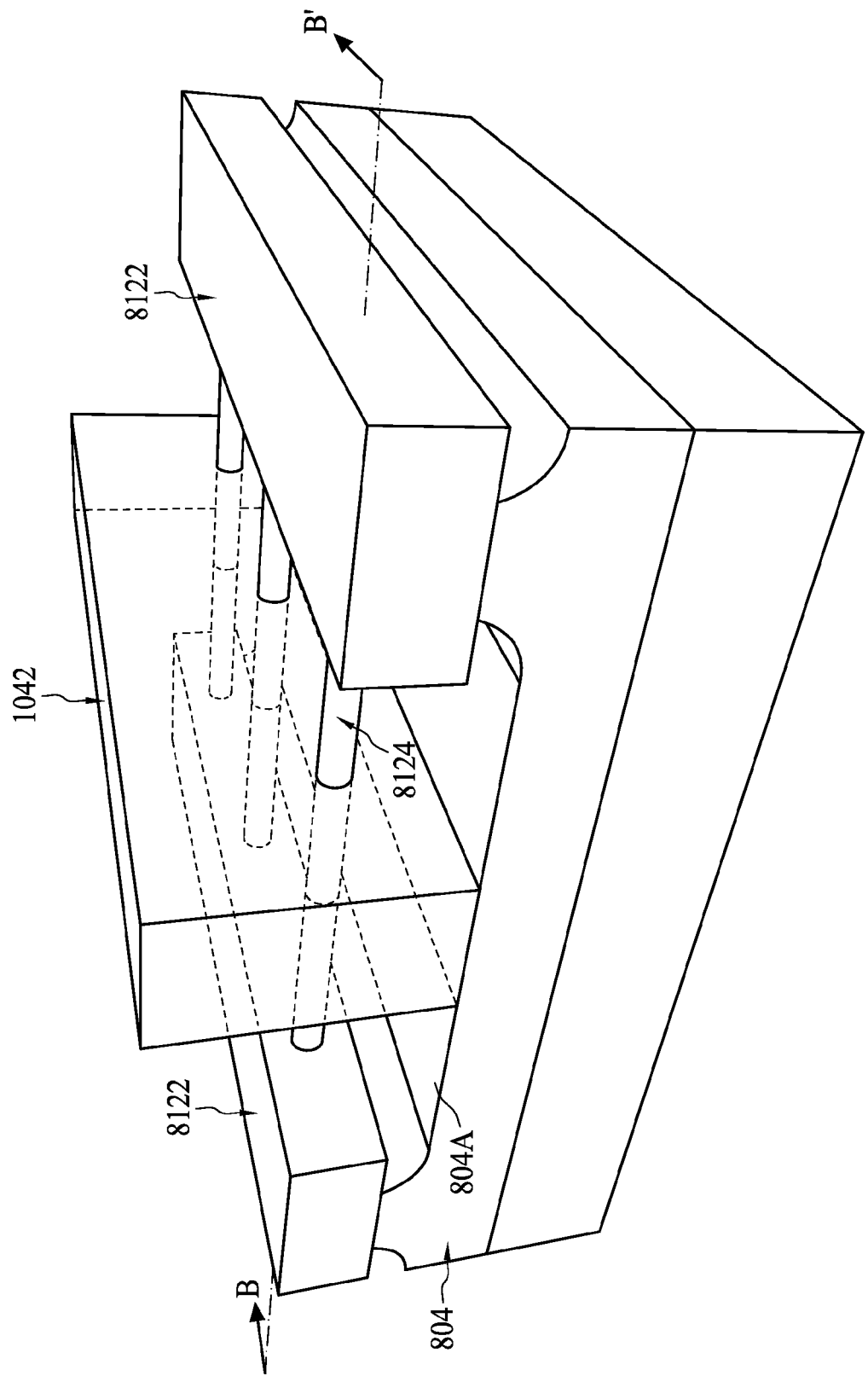
Figure 10B:
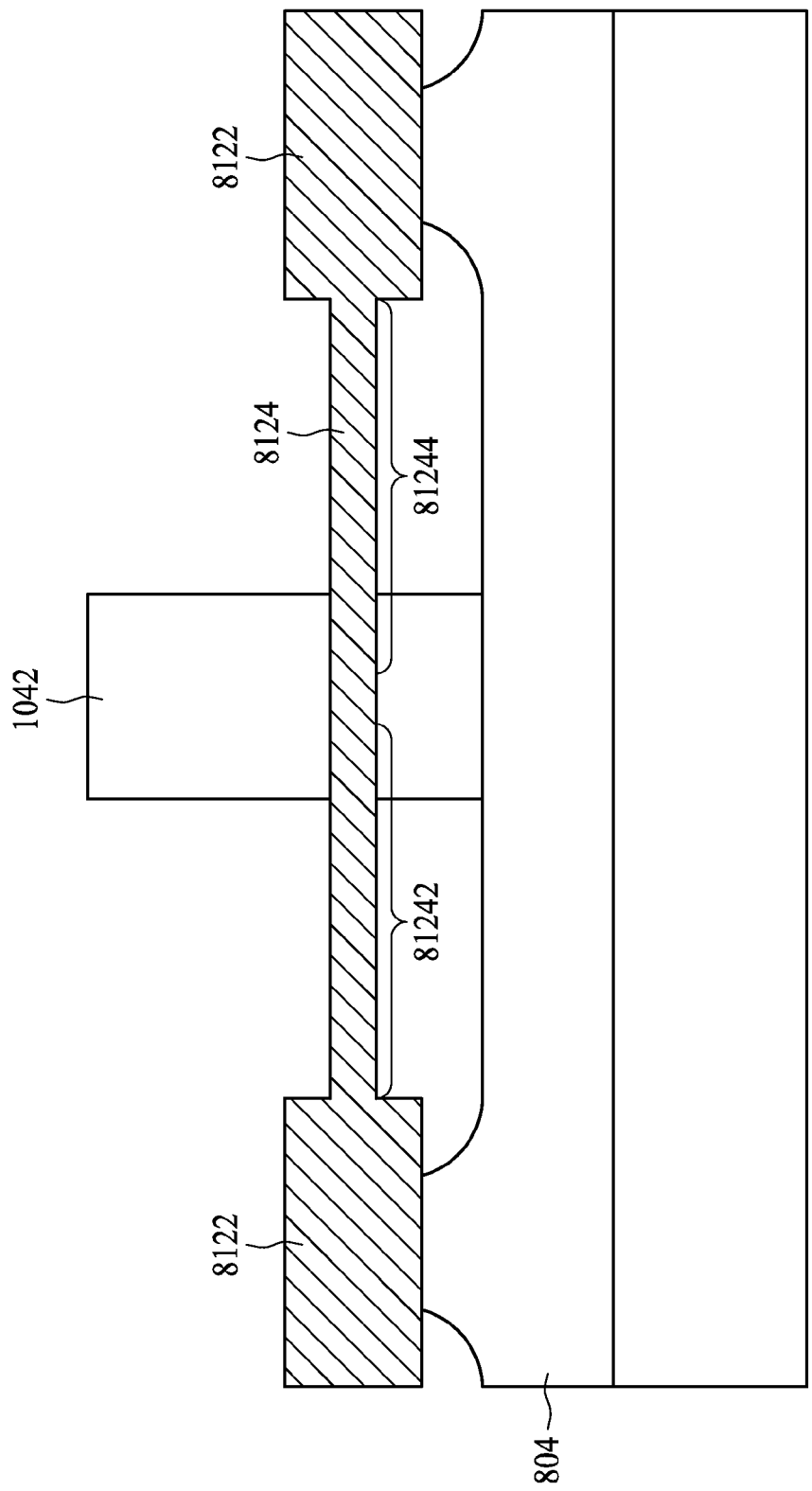

Referring to FIGS. 10A and 10B, a sacrificial gate structure 1042 wrapping around a portion of the nanowire structure 8124 is formed on the surface 804A of the insulator layer 804. In some embodiments, to form the sacrificial gate structure 1042, a sacrificial gate layer is blanket deposited on the pad regions 8122 and the surface 804A of the insulator layer 804. In some embodiments, the sacrificial gate layer includes a lithography patternable dielectric material. In some embodiments, the sacrificial gate layer is deposited using a spin-on coating deposition process. The sacrificial gate layer is then patterned into the sacrificial gate structure 1042. In some embodiments, following formation of the sacrificial gate structure 1042, an annealing process is performed to harden the sacrificial gate structure 1042.

Figure 11A:
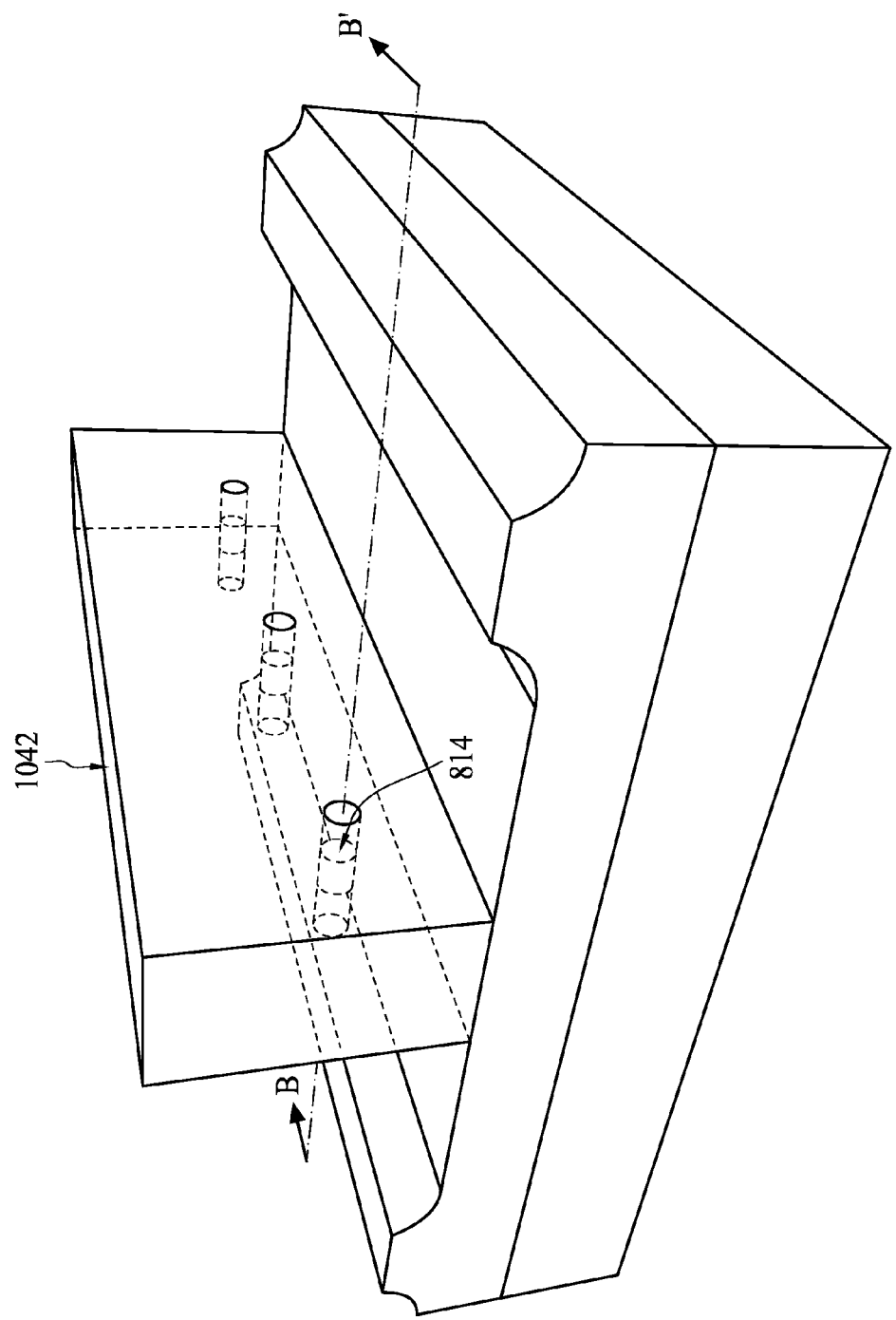
Figure 11B:
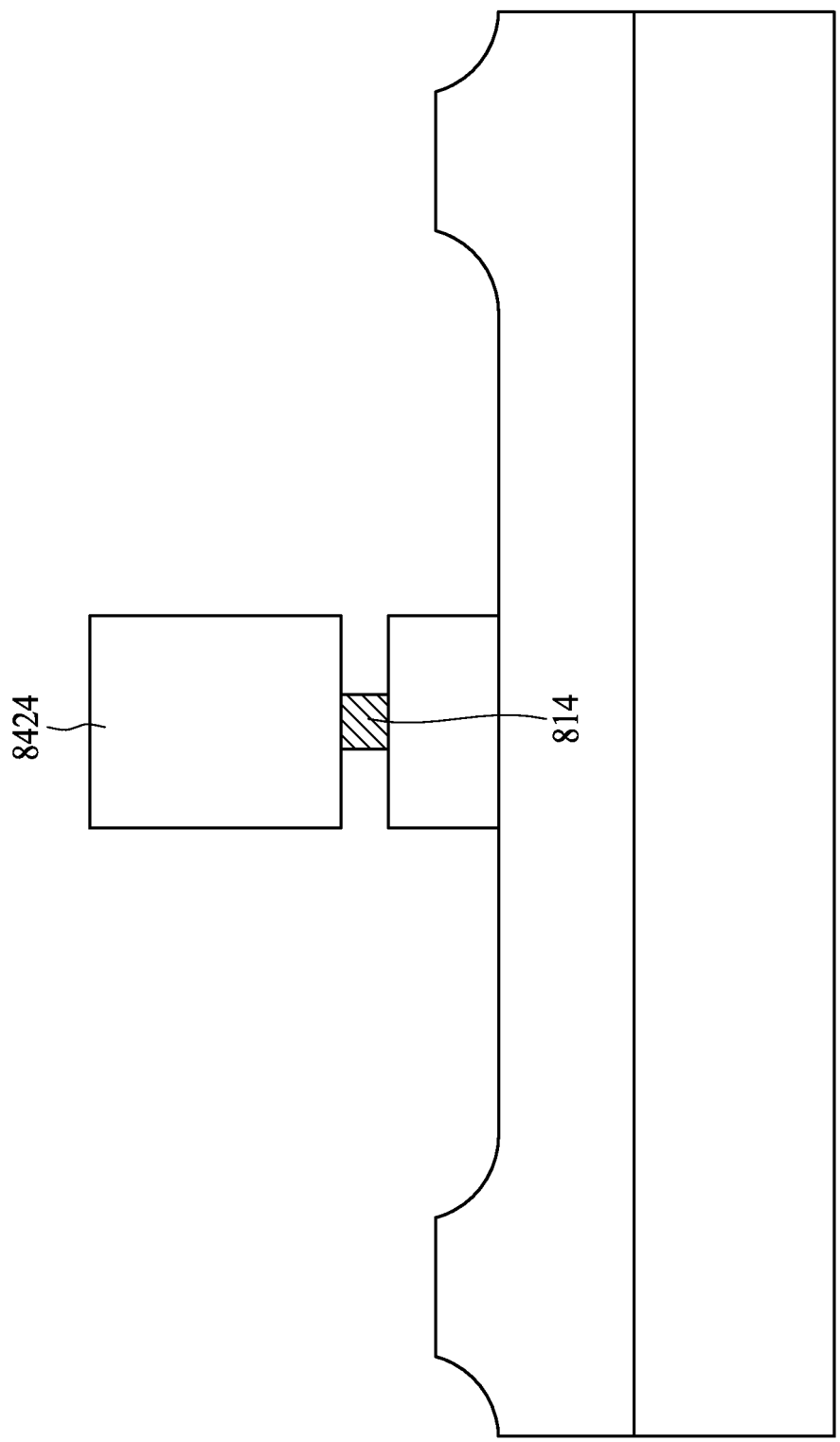

Referring to FIGS. 11A and 11B, the pad regions 8122 and sections 81242 and 81244 (shown in FIGS. 10A and 10B) of the nanowire structure 8124 are removed so that a barrier section 814 remains. In some embodiments, the pad regions 8122 and the sections 81242 and 81244 are removed using an isotropic wet etching process or an isotropic RIE process. Similar to the process described with reference to FIGS. 5-1 to 5-3, in some embodiments, the pad regions 8122 and the sections 81242 and 81244 are removed using an anisotropic dry etching process followed by oxidation of portions of the nanowire structure 8124 wrapped around by the sacrificial gate structure 1042 and removal of the oxides using an isotropic wet etching process.

Figure 12A:
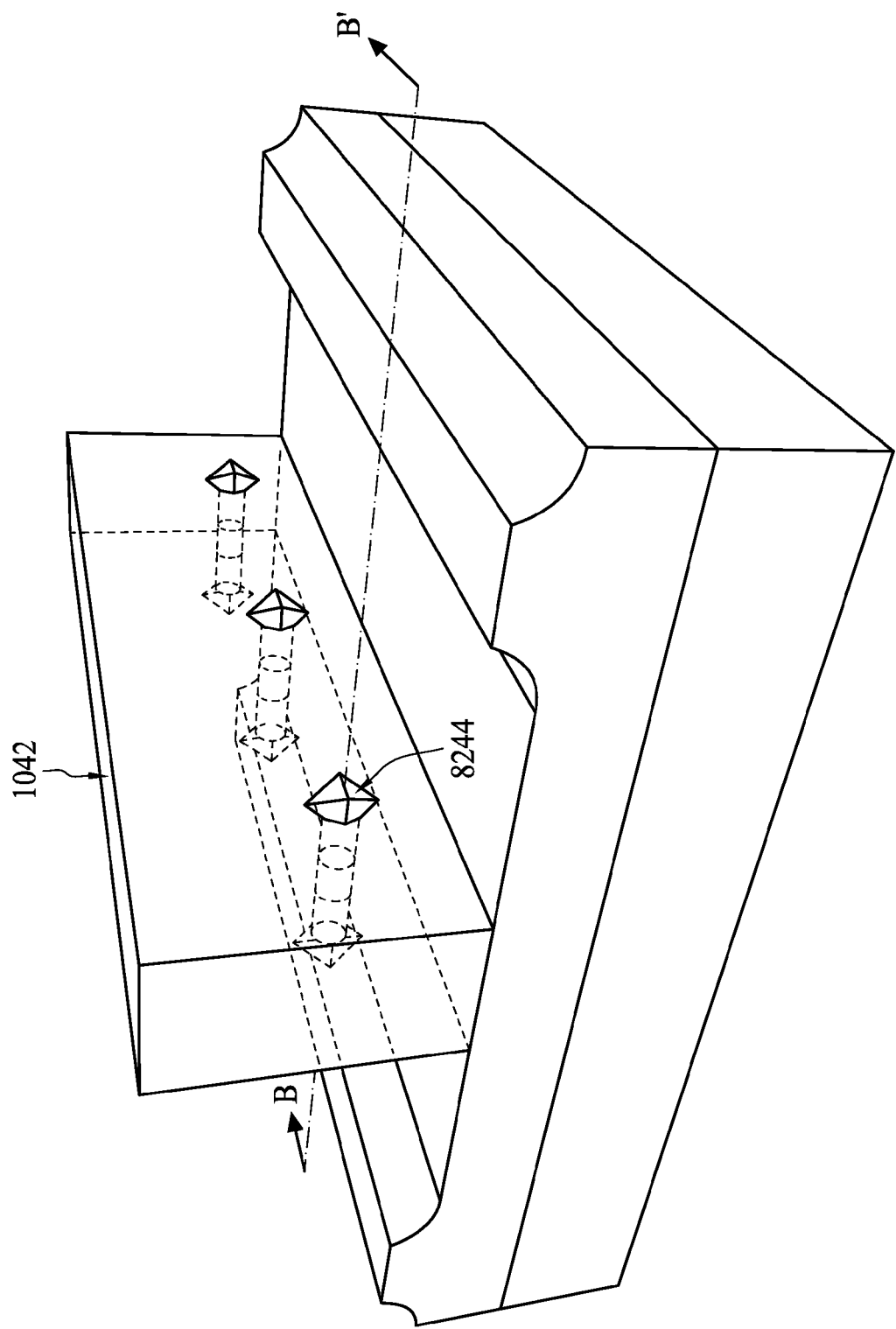
Figure 12B:
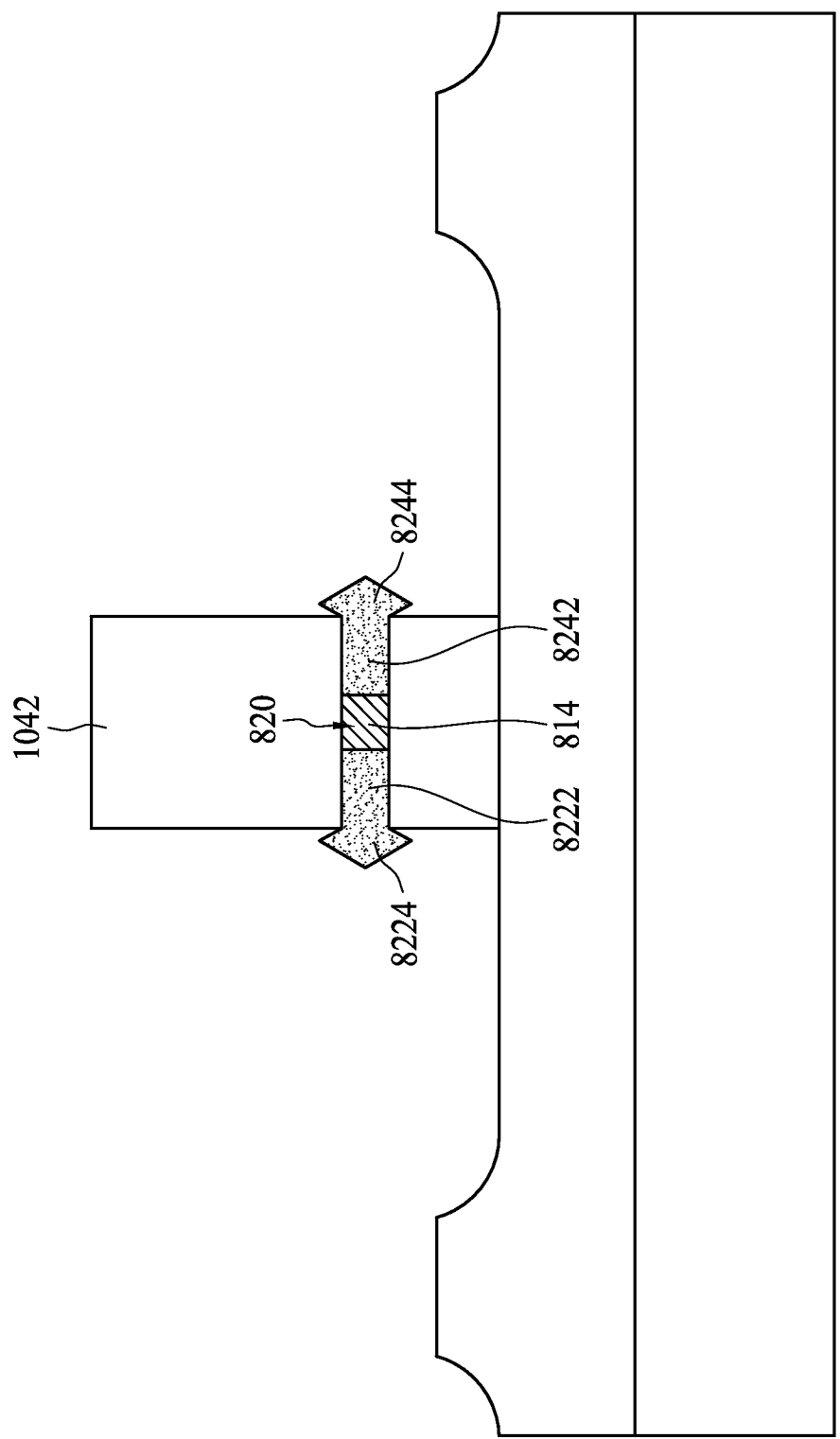

Referring to FIGS. 12A and 12B, the high mobility sections 8222 and 8242 and the corresponding high mobility section extensions 8224 and 8244 are epitaxially grown. The resulting structure is the nanowire structure 820. In some embodiments, the high mobility sections 8222 and 8242 and the corresponding high mobility section extensions 8224 and 8244 are grown on the exposed cross sections of the barrier section 814 (labeled in FIGS. 11A and 11B) using a selective epitaxial growth process. The high mobility extensions 8224 and 8244 are beyond the sacrificial gate structure 1042 and have facets. Exemplary materials of the high mobility sections 8222 and 8242 and the high mobility section extensions 8224 and 8244 have been described with reference to FIGS. 8A and 8B and is omitted here.

Figure 13A:
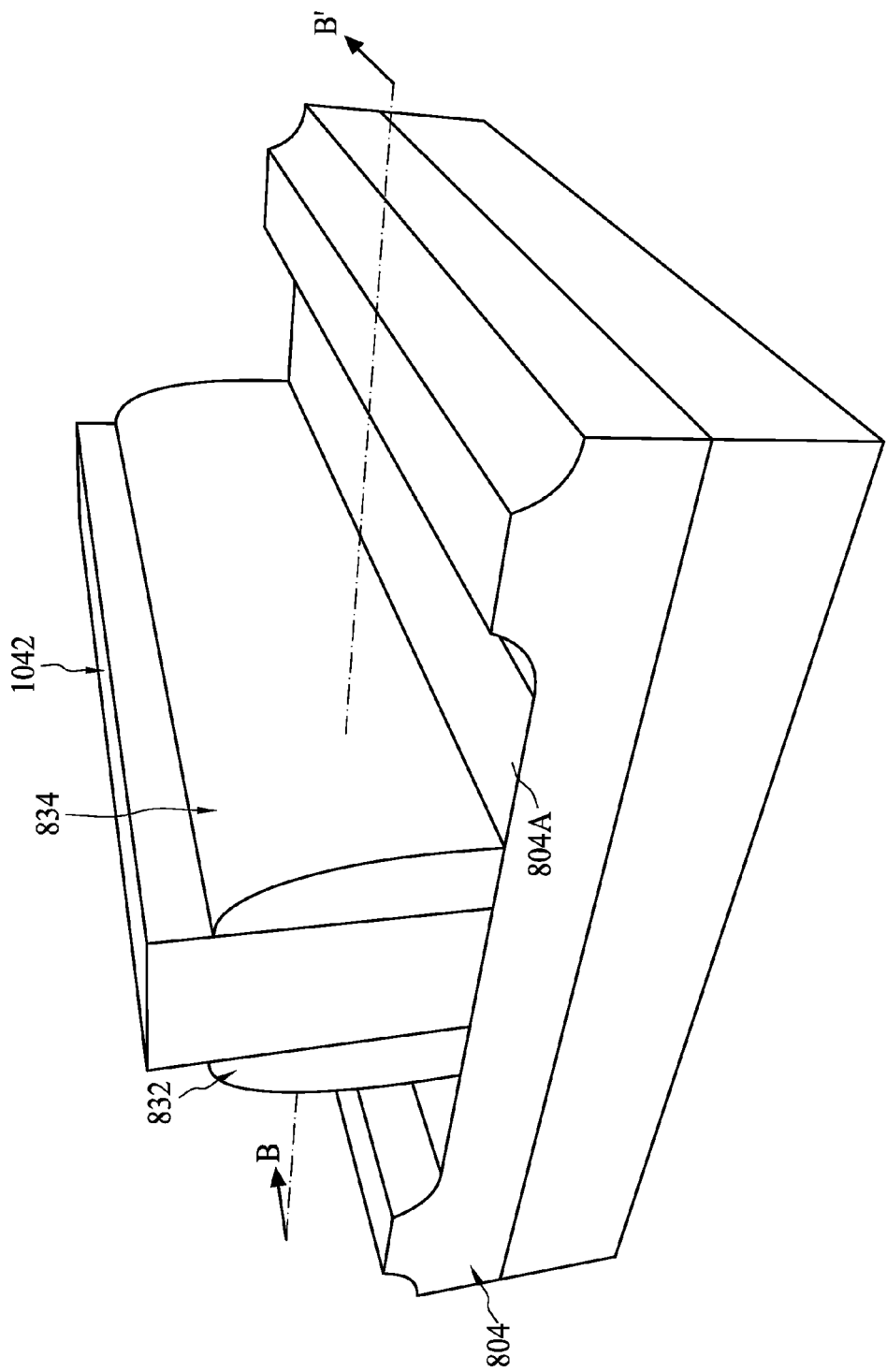
Figure 13B:
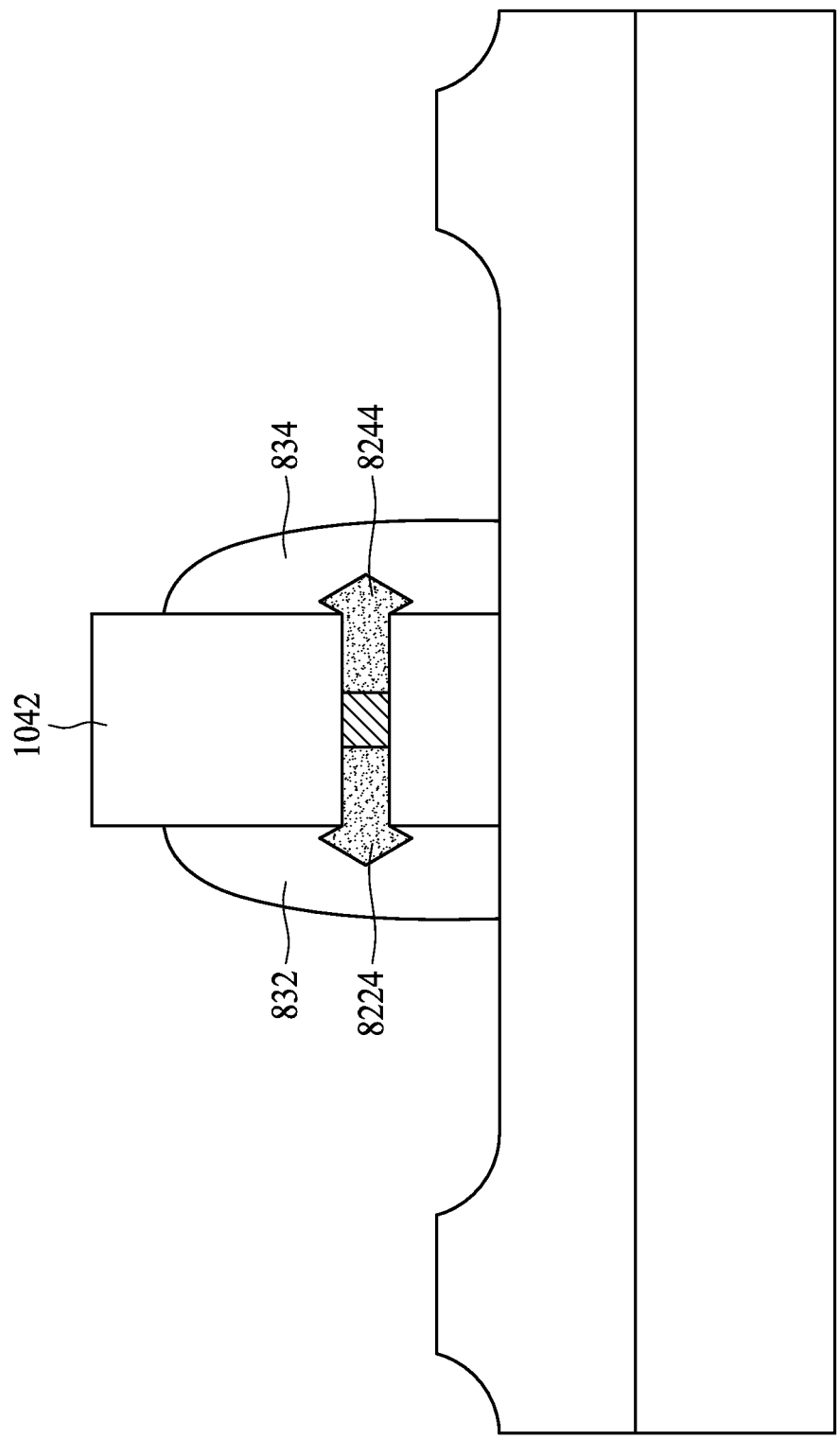

Referring to FIGS. 13A and 13B, the side wall regions 832 and 834 are formed on opposite side of the sacrificial gate structure 1042 and contact the high mobility section extensions 8224 and 8244 (shown in FIGS. 12A and 12B). In some embodiments, in order to form the side wall regions 832 and 834, an amorphous layer is blanket deposited on the exposed portions of the surface 804A of the insulator layer 804, the high mobility section extensions 8224 and 8244, and the sacrificial gate structure 1042. In some embodiments, the amorphous layer is formed in the same chamber as that used to epitaxially grow the high mobility section extensions 8224 and 8244. Following formation of the high mobility section extensions 8224 and 8244, the chemistry in the chamber is changed to result in the formation of the amorphous layer. The use of the same chamber to epitaxially grow the high mobility section extensions 8224 and 8244 and the amorphous layer prevents the formation of an interference such as an oxide material between the high mobility section extension 8224 or 8244 and the side wall region 832 or 834. Then, portions of the amorphous layer are removed to form the side wall regions 832 and 834 using an etching process, such as RIE. In addition, in some embodiments, the high mobility section extensions 8224 and 8244 and the corresponding side wall regions 832 and 834 are doped using, for example, ion implantation to form the source and drain regions 864 and 866 (labeled in FIG. 8B). In other embodiments, the high mobility section extensions 8224 and 8244 and the corresponding side wall regions 832 and 834 are formed of materials that are in-situ doped. Further, in some embodiments, silicide regions (not shown) are formed on the side wall regions 832 and 834, respectively.

Figure 14A:
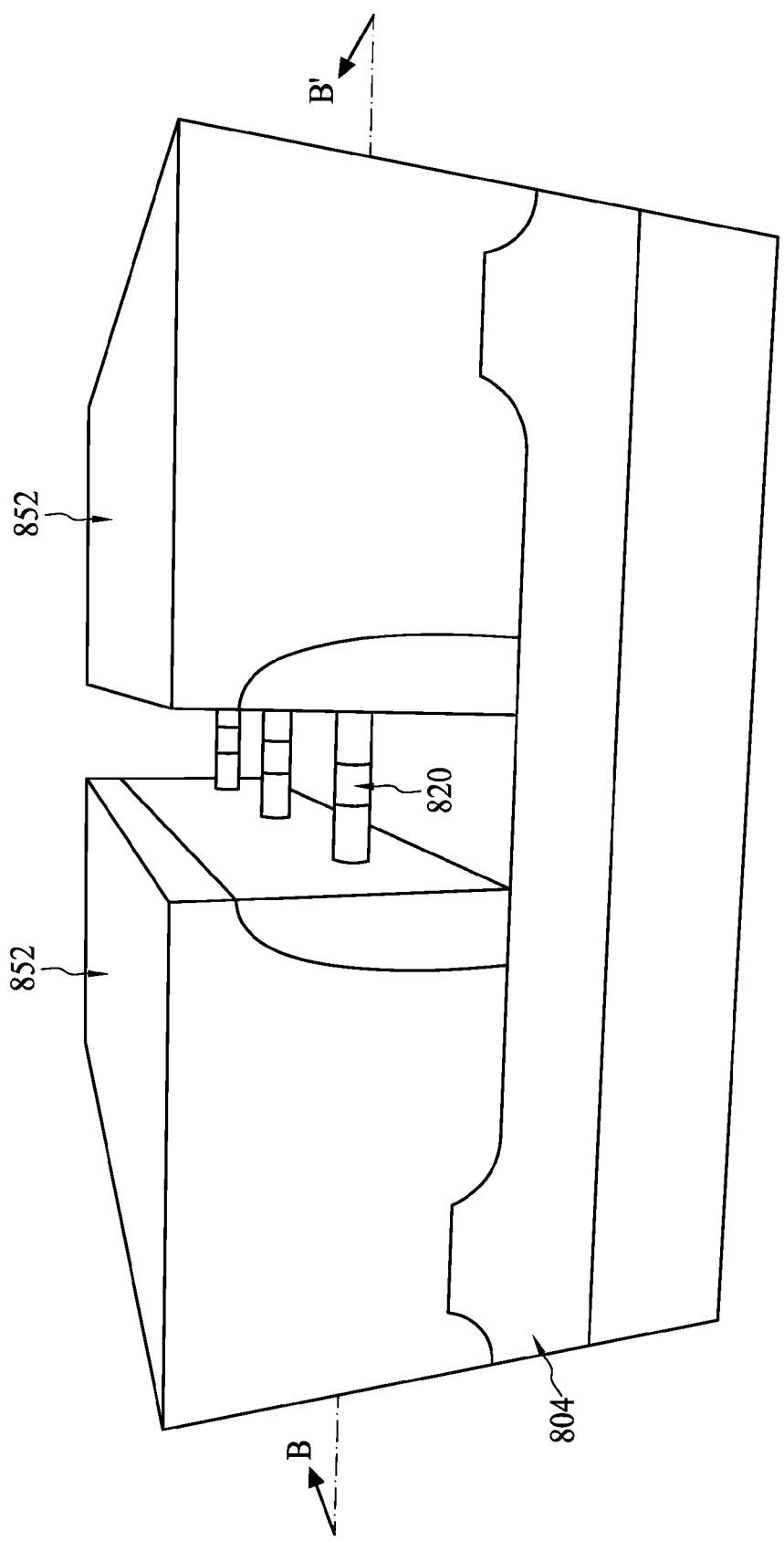
Figure 14B:
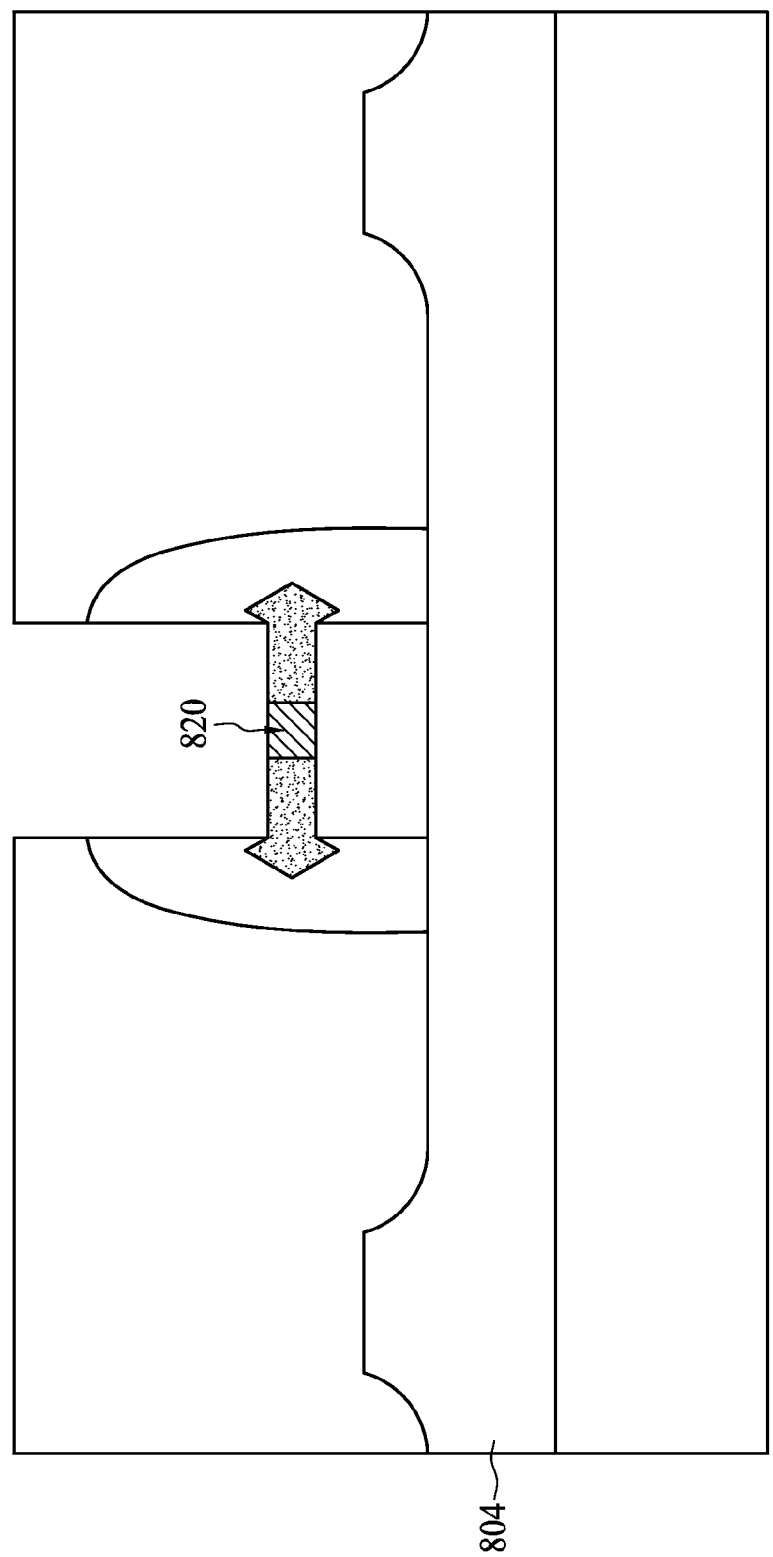

Referring to FIGS. 14A and 14B, ILD layer 852 is formed on the insulator layer 804 and cover exposed side walls of the sacrificial gate structure 1042 (shown in FIGS. 13A and 13B) and the side wall regions 832 and 834, and the sacrificial gate structure 1042 is removed. In some embodiments, the ILD layer 852 is formed as a capping layer over the exposed portions of the insulator layer 804, the sacrificial gate structure 1042 and the side wall regions 834. The capping layer is then planarized until it is planar the sacrificial gate structure 1042 using, for example, CMP. Then, in some embodiments, the sacrificial gate structure 1042 is removed such that the channel region 862 (labeled in FIG. 8B) of the nanowire structure 820 is exposed. In some embodiments, the sacrificial gate structure 1042 is removed using, for example, a chemical etching process that is selective to the material of the sacrificial gate structure 1042 and the material of the ILD layer 852.

Referring to FIGS. 8A and 8B, the gate structure 842 is formed in place of the sacrificial gate structure 1042 (shown removed in FIGS. 14A and 14B). In some embodiments, a gate dielectric layer is formed around the exposed nanowire structure 820. Following the formation of the gate dielectric layer, a gate electrode is formed around the dielectric layer. In some embodiments, a gate electrode layer is formed over the exposed portions of the gate dielectric layer and the ILD layer 852, and is further planarized until it is planar the ILD layer 852 to form the gate electrode. Exemplary materials of the gate dielectric layer and the gate electrode have been provided with references to FIGS. 1A and 1B.

Figure 15:
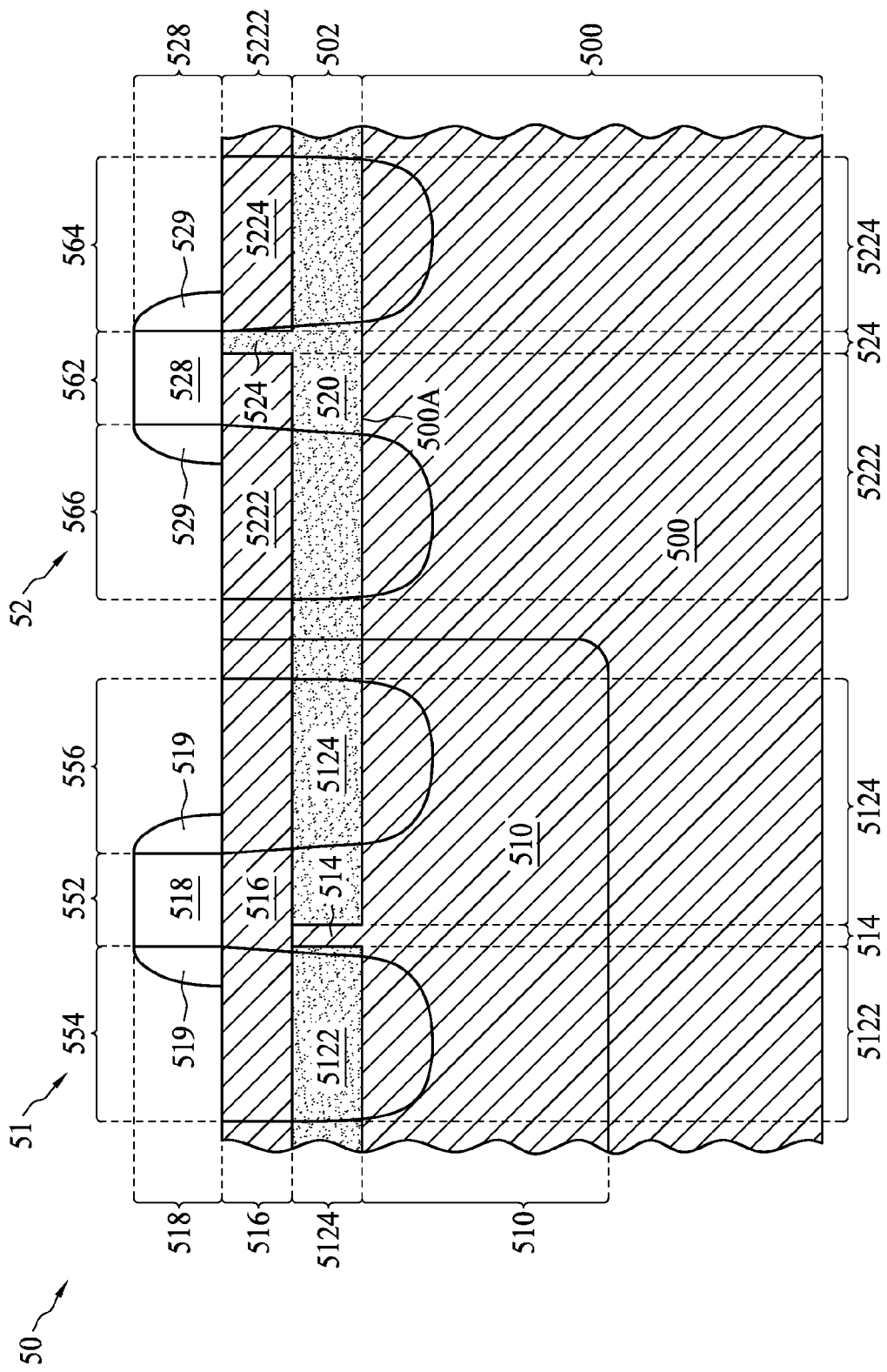
FIG. 15 is a schematic cross-sectional diagram of a planar complementary metal oxide semiconductor (CMOS) structure with a heterostructure channel region for a PMOS structure and a heterostructure channel region for an NMOS structure in accordance with some embodiments.

FIG. 15 is a schematic cross-sectional diagram of a planar complementary metal oxide semiconductor (CMOS) structure 50 with a heterostructure channel region 552 for a PMOS structure 51 and a heterostructure channel region 562 for an NMOS structure 52 in accordance with some embodiments. FIG. 15 illustrates that for the PMOS structure 51, the heterostructure channel region 552 is a buried channel and includes portions of high mobility sections 5122 and 5124 separated by a barrier section 514, and for the NMOS structure 52, the heterostructure channel region 562 is a surface channel and includes portions of high mobility sections 5222 and 5224 separated by a barrier section 524. Referring to FIG. 15, the PMOS structure 51 includes a substrate 500, a heterostructure of the barrier section 514 between the high mobility sections 5122 and 5124, a capping section 516, a well region 510, a gate structure 518 with spacers 519, and source and drain regions 554 and 556. The NMOS structure 52 includes the substrate 500, a stressor section 520, a heterostructure of a barrier section 524 between high mobility sections 5222 and 5224, a gate structure 528 with spacers 529, and source and drain regions 564 and 566.

In some embodiments, the substrate 500 is a bulk semiconductor substrate. In other embodiments, the substrate (not shown) is an SOI substrate. In some embodiments, the substrate 500 is p-type doped. In some embodiments, the substrate 500 has a top surface 500A (labeled at the level of the top surface).

In some embodiments, for the PMOS structure 51, the heterostructure of the barrier section 514 and the high mobility sections 5122 and 5124 is formed on the top surface 500A of the substrate 500. The capping section 516 is formed on the heterostructure of the barrier section 514 and the high mobility sections 5122 and 5124. The n-type well region 510 is formed in the capping section 516, the heterostructure of the barrier section 514 and the high mobility sections 5122 and 5124, and the substrate 500. The gate structure 518 is formed on the capping section 516. The gate structure 518 includes a gate dielectric layer and a gate electrode similar to those described with references to FIGS. 1A and 1B. A channel region 552 of the PMOS structure 51 is located under the gate structure 518 and is a buried channel underneath the capping section 516. The channel region 552 includes portions of the high mobility sections 5122 and 5124 separated by the barrier section 514. Therefore, heterojunctions between the high mobility section 5122 and the barrier section 514, and the high mobility section 5124 and the barrier section 514 are within the channel region 552. Further, the source and drain regions 554 and 556 are formed in the well region 510 on opposite side of the gate structure 518.

In some embodiments, for the NMOS structure 52, the heterostructure of the barrier section 524 and the high mobility sections 5222 and 5224 is formed on the underlying stressor section 520, and the stressor section 520 is formed on the top surface 500A of the substrate 500. The gate structure 528 is formed on the heterostructure of the barrier section 524 and the high mobility sections 5222 and 5224. The gate structure 518 includes a gate dielectric layer and a gate electrode similar to those described with references to FIGS. 1A and 1B. A channel region 562 of the NMOS structure 52 is located under the gate structure 528 and is a surface channel that the gate structure 528 is directly formed on. The channel region 562 includes portions of the high mobility sections 5122 and 5124 separated by the barrier section 524. Therefore, heterojunctions between the high mobility section 5222 and the barrier section 524, and the high mobility section 5224 and the barrier section 524 are within the channel region 562. Further, the source and drain regions 554 and 556 are formed in the corresponding high mobility sections 5222 and 5224, the stressor section 520 and the substrate 500 on opposite sides of the gate structure 528.

In some embodiments, the substrate 500 and the barrier section 514 is formed of relaxed $Si_{1-x}Ge_x$. The high mobility sections 5122, 5124, the stressor section 520, and the barrier section 524 are formed of strained $Si_{1-y}Ge_y$. The capping sections 516, and the high mobility sections 5222 and 5224 are formed of strained $Si_{1-z}Ge_z$, where $0 \leq z < x < y \leq 1$. In this way, the high mobility sections 5122 and 5124 are formed of a material of higher hole mobility compared to Si and are compressively strained by the substrate 500, thereby enhancing the hole mobility. The high mobility sections 5222 and 5224 are formed of a material of higher or the same electron mobility as Si, and are tensily strained by the underlying stressor section 520, thereby enhancing the hole mobility. The substrate 500, the heterostructure for the p-type channel region 552, the stressor section 520 and the heterostructure of the n-type channel region 562 made of other materials such as the compound semiconductor material and its alloy described with references to FIGS. 1A and 1B are within the contemplated scope of the present disclosure.

Figure 16:
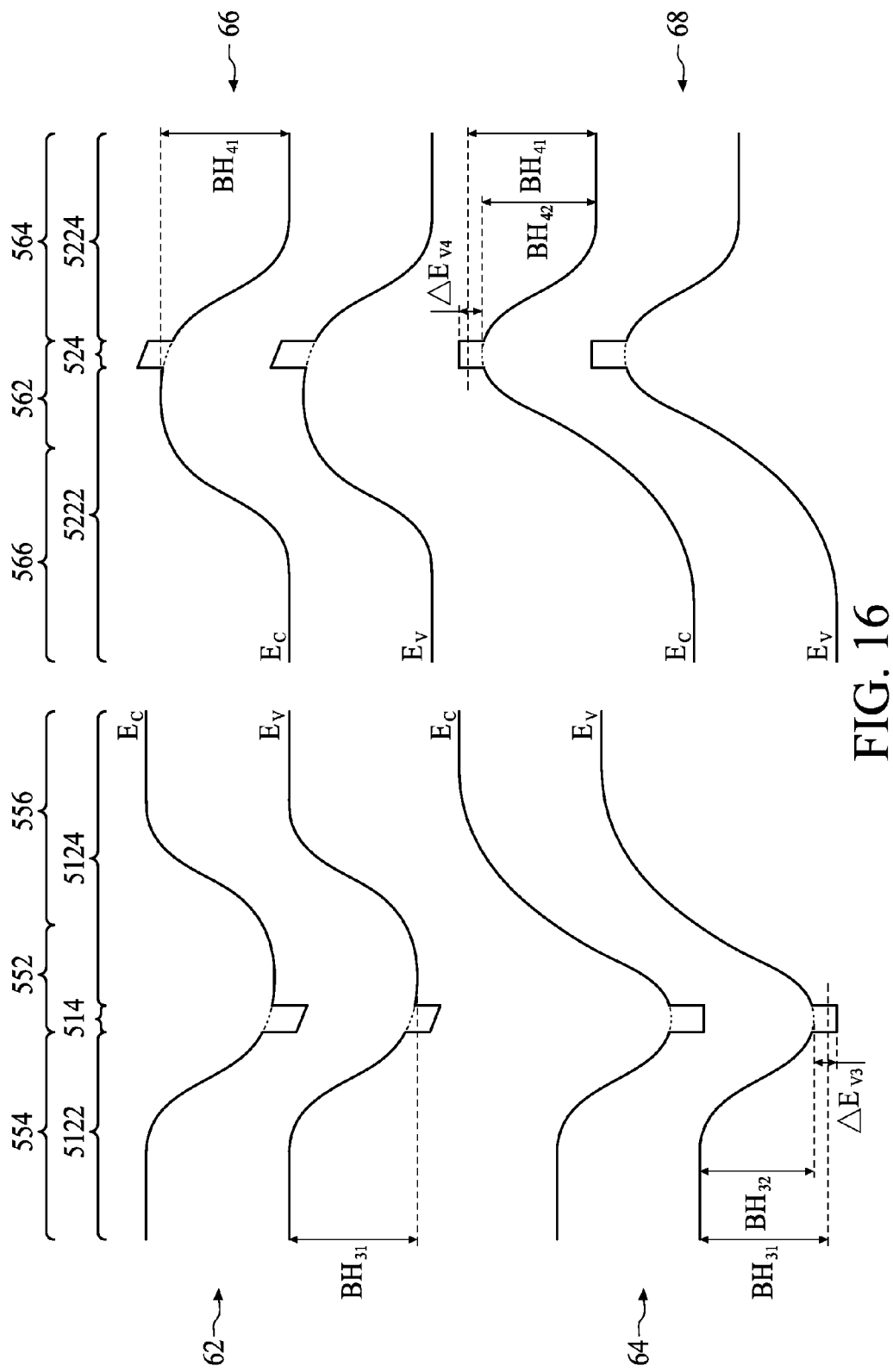
FIG. 16 is a schematic diagram illustrating energy band diagrams of the PMOS structure from the source region to the drain region under various drain voltage conditions, and energy band diagrams of the NMOS structure from the source region to the drain region under various drain voltage conditions.

FIG. 16 is a schematic diagram illustrating energy band diagrams 62 and 64 of the PMOS structure 51 from the source region 554 to the drain region 556 under various drain voltage conditions, and energy band diagrams 66 and 68 of the NMOS structure 52 from the source region 564 to the drain region 566 under various drain voltage conditions. The energy band diagram 62 corresponds to the condition of the PMOS structure 51 in the OFF state, and subjected to a high drain voltage, while the energy band diagram 64 corresponds to the condition of the PMOS structure 51 in the OFF state, and subjected to a low drain voltage. It is shown that when a gate length of the gate structure 518 (shown in FIG. 15) is small, the lowering of the drain voltage induces a barrier of between the p-n junction of the source region 554 and the channel region 552 to lower from a barrier height of $BH_{31}$ to $BH_{32}$. Under the condition that the barrier section 514 has a higher atomic percentage of germanium than the high mobility sections 5122 and 5124, the barrier section 514 has a positive valence band offset $\Delta E_{V3}$ with respect to each of the high mobility sections 5122 and 5124, thereby reducing a leakage from the source region 5122 to the drain region 5124. In addition, the energy band diagram 66 corresponds to the condition of the NMOS structure 52 in the OFF state, and subjected to a low drain voltage, while the energy band diagram 64 corresponds to the condition of the NMOS structure 52 in the OFF state, and subjected to a high drain voltage. Under the condition that the barrier section 524 has a higher atomic percentage of silicon than the high mobility sections 5222 and 5224, the barrier section 524 has a positive conduction band offset $\Delta E_{V4}$ with respect to each of the high mobility sections 5222 and 5224, thereby reducing a leakage current when the barrier of the source region 564 to the channel region 562 is lowered from a barrier height $H_{41}$ to a barrier height $H_{42}$ due to increasing of the drain voltage.

Figure 17:
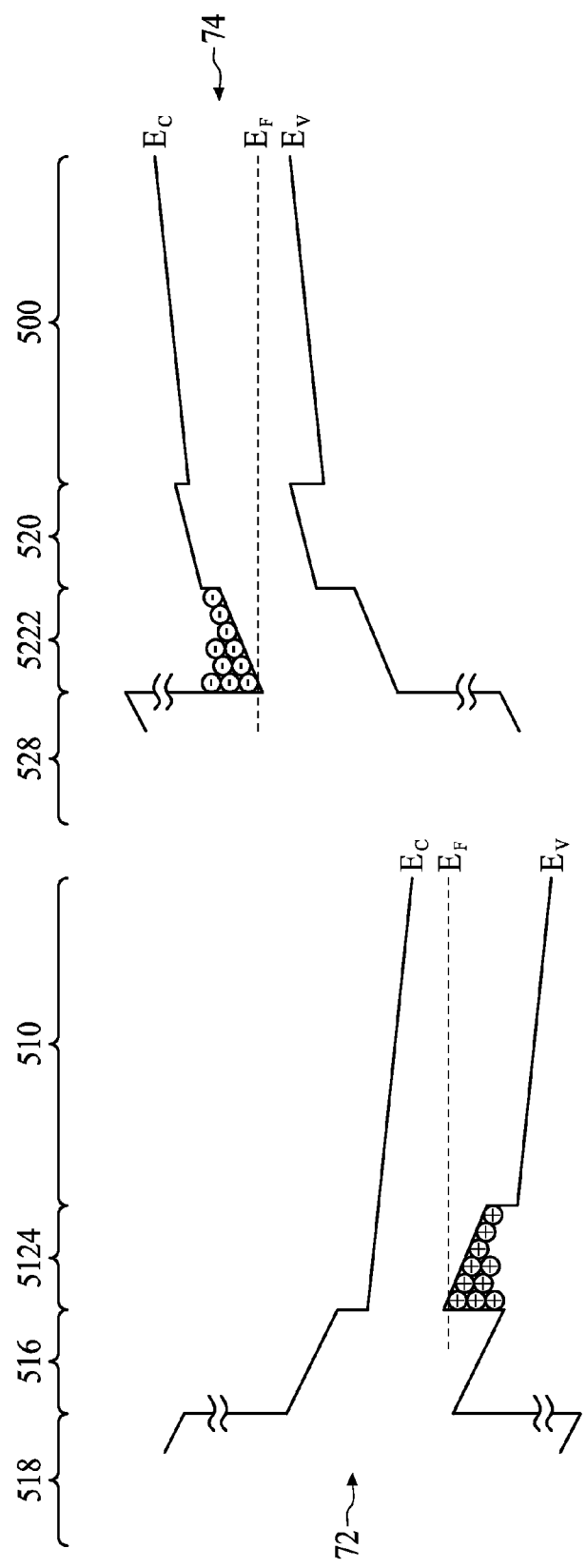
FIG. 17 is a schematic diagram illustrating an energy band diagram of the PMOS structure from the gate structure to the well region in the substrate, and an energy band diagram of the NMOS structure from the gate structure to the substrate in accordance with some embodiments.

FIG. 17 is a schematic diagram illustrating an energy band diagram 72 of the PMOS structure 51 from the gate structure 518 to the well region 510 in the substrate 500, and an energy band diagram 74 of the NMOS structure 52 from the gate structure 528 to the substrate 500 in accordance with some embodiments. For the PMOS structure 51, when the gate voltage is lowered, the valence band $E_V$ of the high mobility section 5124 will be bent close enough to the Fermi level $E_F$ towards an interface between the capping section 516 and the high mobility section 5124, and causes an inversion layer of holes. Further, due to a positive valence band offset of the well region 510 in the substrate 500 from the high mobility section 5124, the inversion layer of holes are confined in a quantum well. In some embodiments, a surface channel in the capping section 516 is avoided by using p+ polysilicon as the material of the gate electrode. For the NMOS structure 52, when the gate voltage is increased, the valence band $E_V$ of the high mobility section 5222 will be bent close enough to the Fermi level $E_F$ towards an interface between the gate dielectric layer of the gate structure 528 and the high mobility section 5222, and causes an inversion layer of electrons. Further, due to a positive conduction band offset of the stressor section 520 from the high mobility section 5222, the inversion layer of electrons are confined in a quantum well.

Figure 18:
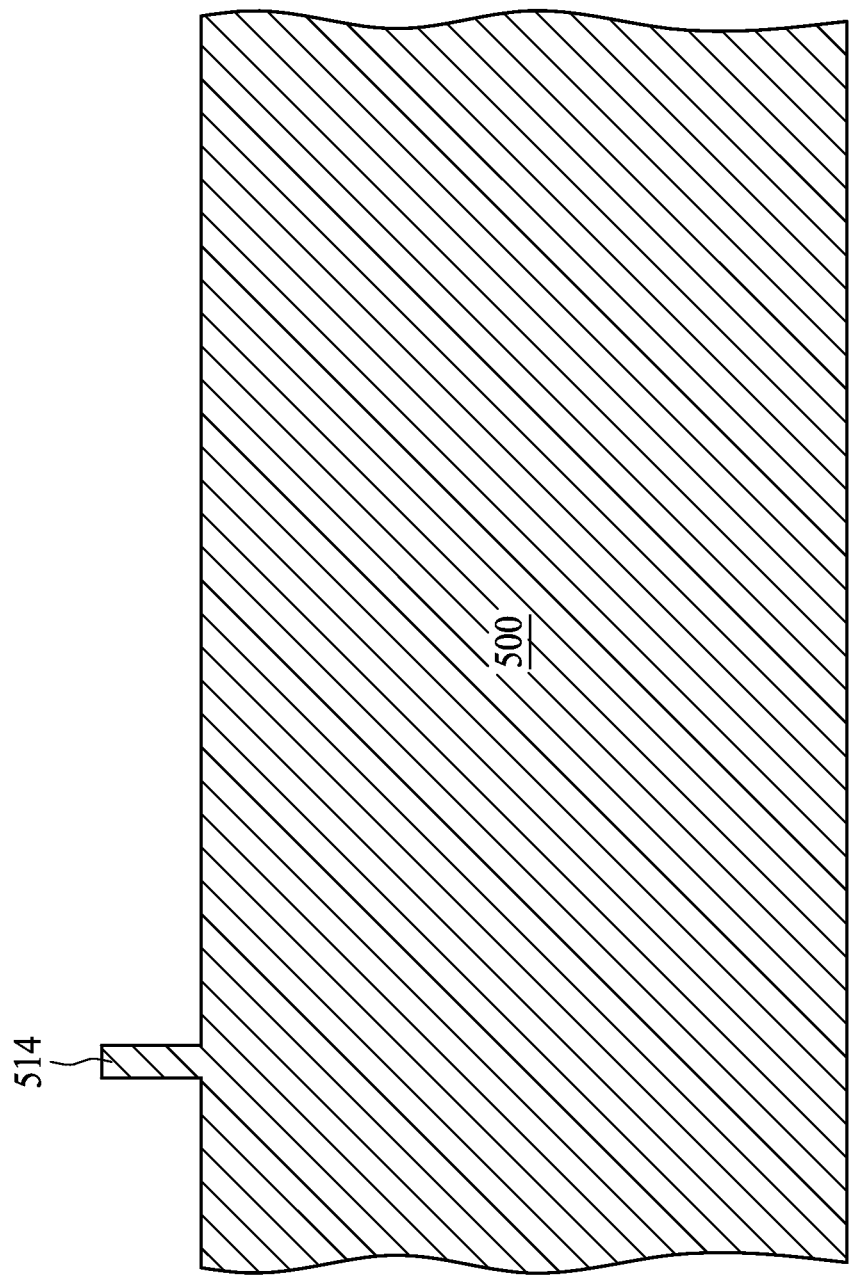
FIGS. 18 to 21 are schematic cross-sectional diagrams of semiconductor structures formed by operations in a fabrication process of the CMOS structure in FIG. 15 in accordance with some embodiments.
Figure 19:
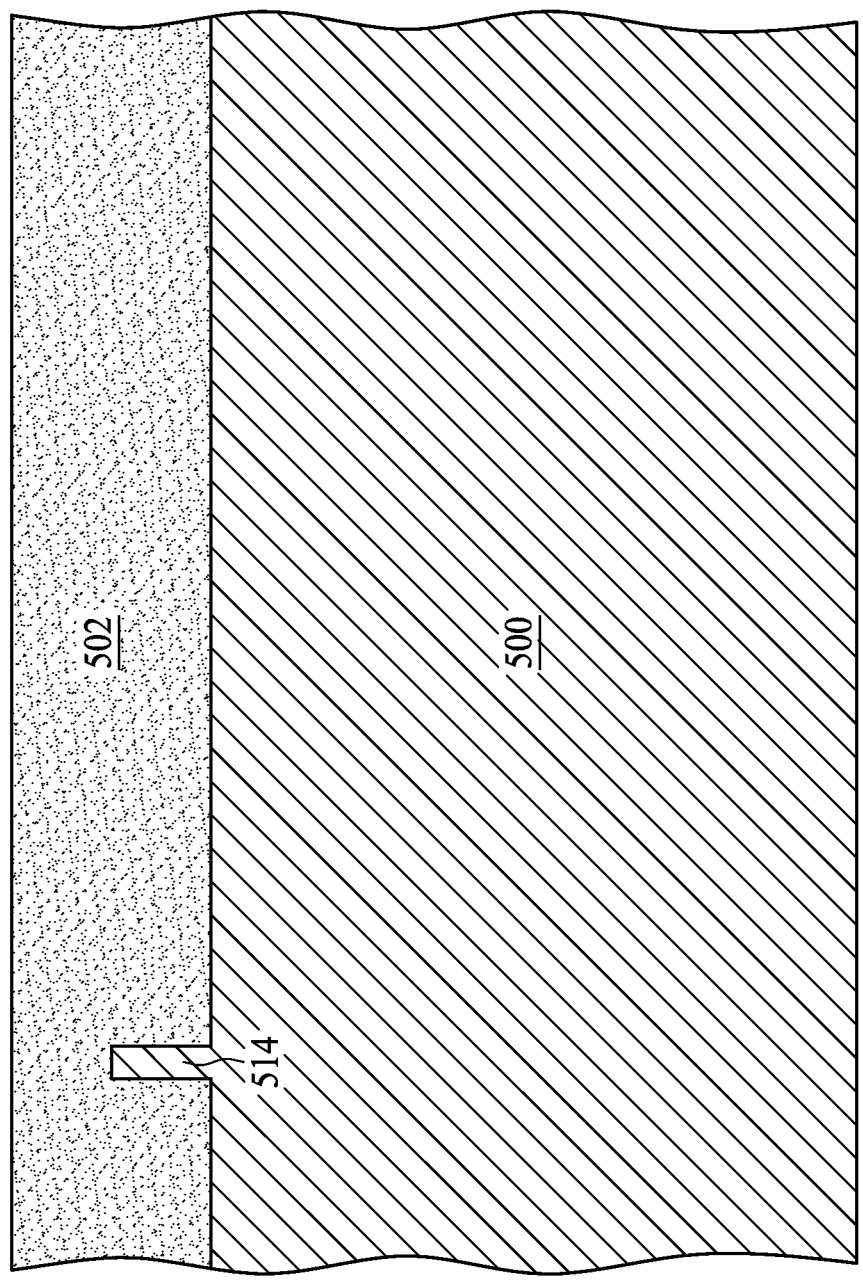
Figure 20:
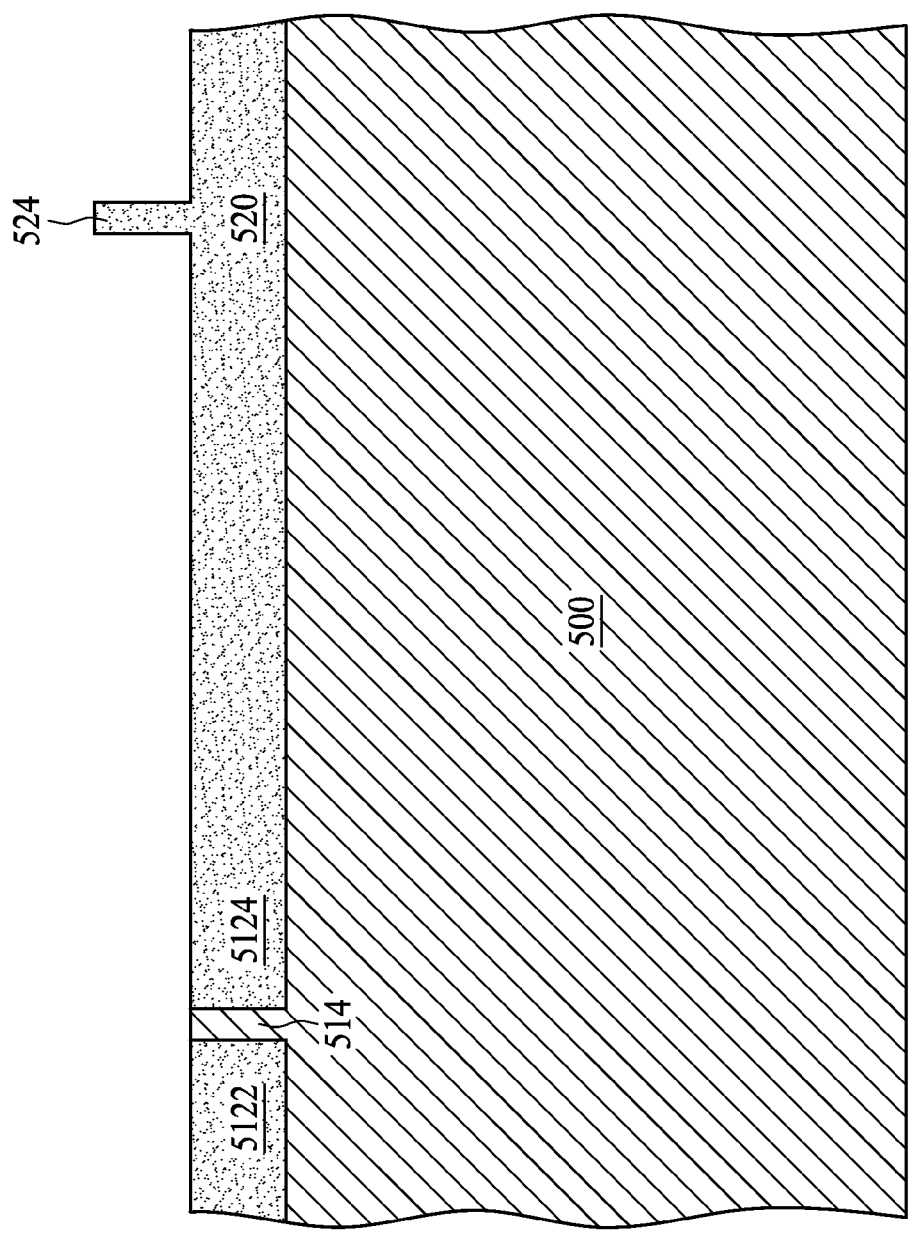
Figure 21:
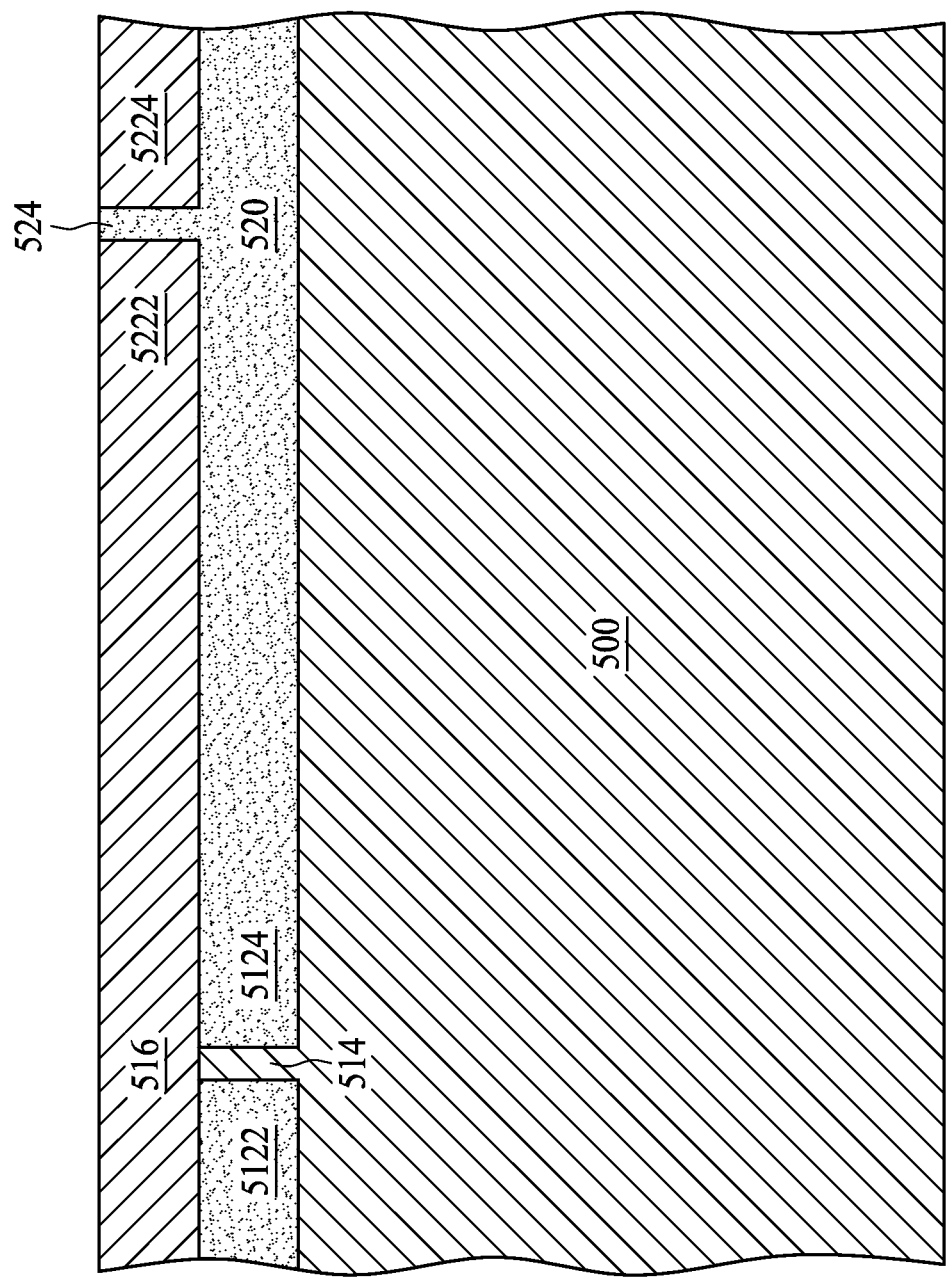

FIGS. 18 to 21 are schematic cross-sectional diagrams of semiconductor structures formed by operations in a fabrication process of the CMOS structure 50 in FIG. 15 in accordance with some embodiments. Referring to FIG. 18, portions of a substrate is removed so as to form the barrier section 514 on the substrate 500. Methods for forming the barrier section 514 have been described with references to FIGS. 5-1 to 5-3 and are omitted here. Referring to FIG. 19, a high mobility layer 502 is formed on the substrate 500. Referring to FIG. 20, portions of the high mobility layer 502 is removed so as to form the high mobility sections 5122 and 5124 separated by the barrier section 514 and the barrier section 524 on the stressor section 520. Referring to FIG. 21, a layer with the capping section 516 and the high mobility sections 5222 and 5224 is formed on the layer with the barrier section 514 between the high mobility sections 5122 and 5124, and the stressor section 520.

Referring to FIG. 15, further, in accordance with some embodiments, a well region 510 is formed in the capping section 516, high mobility sections 5122 and 5124 separated by the barrier section 514 and the substrate 500. The gate structure 518 and the spacers 519 are formed on the capping section 516 and above the channel region 552 composed by the high mobility sections 5122 and 5124 separated by the barrier section 514. The source and drain regions 554 and 556 are formed on opposite sides of the gate structure 518. Similarly, the gate structure 528 and the spacers 529 are formed on the channel region composed by the high mobility sections 5222 and 5224 separated by the barrier section 524. The source and drain regions 564 and 566 are formed on opposite sides of the gate structure 528.

Some embodiments have one or a combination of the following features and/or advantages. In some embodiments, a FinFET structure, a nanowire FET structure, or a planar FET structure has a barrier section in a high mobility channel region. The barrier section and the high mobility channel region are formed of materials with a different atomic percentage in an element or a compound that induces the enhancement in mobility. Therefore, the barrier section reduces a leakage current due to, for example, drain induced barrier lowering during the OFF state of the transistor, and allows a conduction channel to be formed during the ON state of the transistor.

In some embodiments, a field effect transistor (FET) structure comprises a heterostructure, and a gate structure. The heterostructure comprises a first section, a barrier section and a second section such that a portion of the first section, the barrier section, and a portion of the second section form a channel region, and portions of the first section and the second section on opposite sides of the channel region form at least a portion of a first source or drain region and at least a portion of a second source or drain region, respectively. A band gap of the barrier section overlaps with a band gap of each of the first section and the second section. When the channel region is p type, the barrier section has a positive valence band offset with respect to each of the first section and the second section, or when the channel region is n type, the barrier section has a positive conduction band offset with respect to each of the first section and the second section. A gate structure is configured on the channel region.

In some embodiments, in a method, a first layer is provided. A first section and a second section of the first layer are removed such that a barrier section between the first section and the second section remains. A third section and a fourth section are epitaxially grown in place of the first section and the second section. A band gap of the barrier section overlaps with a band gap of each of the first section and the second section. When the channel region is p type, the barrier section has a positive valence band offset with respect to each of the third section and the fourth section, or when the channel region is n type, the barrier section has a positive conduction band offset with respect to each of the third section and the fourth section. A gate structure is formed over a portion of the third section, the barrier section, and the fourth section.

In some embodiments, a semiconductor structure comprises a heterostructure, a gate structure, a first doping region and a second doping region. The heterostructure comprises a barrier section forming heterojunctions with a first section and a second section, respectively. A band gap of the barrier section overlaps with a band gap of each of the first section and the second section. When the channel region is p type, the barrier section has a positive valence band offset with respect to each of the first section and the second section, or when the channel region is n type, the barrier section has a positive conduction band offset with respect to each of the first section and the second section. The gate structure is configured on a portion of the heterostructure comprising the heterojunctions. The gate structure comprises a dielectric layer, and a gate electrode stacked over the dielectric layer. The first doping region and the second doping region are configured in the first section and the second section on opposite sides of the gate structure, respectively. Each of the first doping region and the second doping region has an opposite conductivity type with respect to the portion of the heterostructure on which the gate structure is configured.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A field effect transistor (FET) structure, comprising:
a heterostructure comprising:
    a first section, a barrier section and a second section such that a portion of the first section, the barrier section, and a portion of the second section form a channel region, and portions of the first section and the second section on opposite sides of the channel region form at least a portion of a first source or drain region and at least a portion of a second source or drain region, respectively,
        a band gap of the barrier section overlapping with a band gap of each of the first section and the second section, and
        when the channel region is p type, the barrier section having a positive valence band offset with respect to each of the first section and the second section, or when the channel region is n type, the barrier section having a positive conduction band offset with respect to each of the first section and the second section; and
a gate structure configured over the channel region;
wherein the heterostructure forms a nanowire structure suspended over a surface of a substrate;
wherein:
for the p type channel region,
    the barrier section is formed of $Si_{1-x}Ge_x$, and
    the first section and the second section are formed of $Si_{1-y}Ge_y$, where $0 \leq x < y \leq 1$; or
for the n type channel region,
    the barrier section is formed of $Si_xGe_{1-x}$, and
the first section and the second section are formed of $Si_yGe_{1-y}$, where $0 \leq x < y \leq 1$.

2. The FET structure of claim 1, wherein:
the heterostructure forms at least a portion of a fin structure protruding from the surface of the substrate; and
the gate structure wraps around the channel region.

3. The FET structure of claim 1, wherein:
the first section and the second section of the hetero structure are strained by a portion of the fin structure beneath the heterostructure; and
the barrier section has the same material as the portion of the fin structure beneath the heterostructure.

4. The FET structure of claim 1, wherein:
the heterostructure is formed in a layer over a surface of a substrate; and
the gate structure is configured over the channel region.

5. The FET structure of claim 1, wherein:
the gate structure wraps around the channel region.

6. A field effect transistor (FET) structure, comprising:
a heterostructure comprising:
    a first section, a barrier section and a second section such that a portion of the first section, the barrier section, and a portion of the second section form a channel region, and portions of the first section and the second section on opposite sides of the channel region form at least a portion of a first source or drain region and at least a portion of a second source or drain region, respectively,
        a band gap of the barrier section overlapping with a band gap of each of the first section and the second section, and
        when the channel region is p type, the barrier section having a positive valence band offset with respect to each of the first section and the second section, or when the channel region is n type, the barrier section having a positive conduction band offset with respect to each of the first section and the second section; and
a gate structure configured over the channel region;
wherein the heterostructure forms a nanowire structure suspended over a surface of a substrate;
wherein:
for the p type channel region,
    the barrier section is formed of $GaAs_{1-x}Sb_x$, and
    the first section and the section are formed of $GaAs_{1-y}Sb_y$, where $0 \leq x < y \leq 1$; or
for the n type channel region,
    the barrier section is formed of $In_xGa_{1-x}As$, and
    the first section and the section are formed of $In_yGa_{1-y}As$ or $GaAs_{1-y}Sb_y$, where $0 \leq x < y \leq 1$.

7. A method, comprising:
providing a first layer;
removing a first section and a second section of the first layer such that a barrier section between the first section and the second section remains;
epitaxially growing a third section and a fourth section in place of the first section and the second section,
    a band gap of the barrier section overlapping with a band gap of each of the first section and the second section, and
    when the channel region is p type, the barrier section having a positive valence band offset with respect to each of the third section and the fourth section, or when the channel region is n type, the barrier section having a positive conduction band offset with respect to each of the third section and the fourth section; and
forming a gate structure over a portion of the third section, the barrier section, and the fourth section;
wherein:
providing a first layer comprises:
    forming a nanowire structure suspended over a surface of a substrate by pad regions,
        the nanowire structure comprising the first layer; and
    forming a sacrificial gate structure wrapping around a portion of the nanowire structure;
removing a first section and a second section of the first layer comprises:
    removing the pad regions and the first section and the second section of the first layer; and
forming a gate structure over a portion of the third section, the barrier section, and the fourth section comprises:
    forming a gate structure in place of the sacrificial gate structure.

8. A method, comprising:
providing a first layer;
removing a first section and a second section of the first layer such that a barrier section between the first section and the second section remains;
epitaxially growing a third section and a fourth section in place of the first section and the second section,
    a band gap of the barrier section overlapping with a band gap of each of the first section and the second section, and
    when the channel region is p type, the barrier section having a positive valence band offset with respect to each of the third section and the fourth section, or when the channel region is n type, the barrier section having a positive conduction band offset with respect to each of the third section and the fourth section; and forming a gate structure over a portion of the third section, the barrier section, and the fourth section;

wherein:

removing a first section and a second section of the first layer comprises:

forming a hard mask over a portion of the first section, the barrier section and a portion of the second section;

etching portions of the first layer on two sides of the hard mask;

converting the portion of the first section, the portion of the second section into a selectively etchable material with respect to a material of the barrier section; and etching the converted portion of the first section and the portion of the section.

9. The method of claim 8, wherein:

providing a first layer comprises:

forming a fin structure protruding from a surface of a substrate, the fin structure comprising the first layer; and forming a gate structure over a portion of the third section, the barrier section, and the fourth section comprises:

forming the gate structure wrapping around the portion of the third section, the barrier section, and the portion of the fourth section.

10. The method of claim 8, wherein:

providing a first layer comprises:

providing a substrate or forming the first layer over a surface of a substrate; and forming a gate structure over a portion of the third section, the barrier section, and the fourth section comprises:

forming the gate structure over the portion of the third section, the barrier section, and the portion of the fourth section.

11. The method of claim 8, wherein:

for the p-type channel region, providing a first layer comprises:

providing the first layer formed of $Si_{1-x}Ge_x$; and epitaxially growing a third section and a fourth section in place of the first section and the second section comprises:

providing the third section and the forth section formed of $Si_{1-y}Ge_y$, where $0 \leq x < y \leq 1$; or for the n-type channel region, providing a first layer comprises:

providing the first layer formed of $Si_xGe_{1-x}$; and epitaxially growing a third section and a fourth section in place of the first section and the second section comprises:

providing the third section and the forth section formed of $Si_yGe_{1-y}$, where $0 \leq x < y \leq 1$.

12. The method of claim 8, wherein:

converting the portion of the first section, the portion of the second section and the remaining portions of the first layer on the two sides of the hard mask into a selectively etchable material with respect to a material of the barrier section comprises:

oxidizing the portion of the first section, the portion of the second section and the remaining portions of the first layer on the two sides of the hard mask.

13. A semiconductor structure, comprising:

a heterostructure comprising:

a barrier section forming heterojunctions with a first section and a second section, respectively, a band gap of the barrier section overlapping with a band gap of each of the first section and the second section, and when the channel region is p type, the barrier section having a positive valence band offset with respect to each of the first section and the second section, or when the channel region is n type, the barrier section having a positive conduction band offset with respect to each of the first section and the second section;

a gate structure configured over a portion of the heterostructure comprising the heterojunctions, the gate structure comprising a dielectric layer, and a gate electrode stacked over the dielectric layer; and a first doping region and a second doping region configured in the first section and the second section on opposite sides of the gate structure, respectively, each of the first doping region and the second doping region having an opposite conductivity type with respect to the portion of the heterostructure over which the gate structure is configured;

wherein the heterostructure forms a nanowire structure suspended over a surface of a substrate.

14. The semiconductor structure of claim 13, wherein:

the heterostructure forms at least a portion of a fin structure protruding from the surface of the substrate; and the gate structure wraps around the portion of the heterostructure comprising the heterojunctions.

15. The semiconductor structure of claim 14, wherein:

the first section and the second section of the hetero structure are strained by a portion of the fin structure beneath the heterostructure; and the barrier section has the same material as the portion of the fin structure beneath the heterostructure.

16. The semiconductor structure of claim 13, wherein:

the heterostructure is formed in a layer over a surface of a substrate; and the gate structure is configured over the portion of the heterostructure comprising the heterojunctions.

17. The semiconductor structure of claim 13, wherein:

the gate structure wraps around the portion of the heterostructure comprising the heterojunctions.

18. The semiconductor structure of claim 13, wherein:

for the p type channel region, the barrier section is formed of $Si_{1-x}Ge_x$, and the first section and the second section are formed of $Si_{1-y}Ge_y$, where $0 \leq x < y \leq 1$; or for the n type channel region, the barrier section is formed of $Si_xGe_{1-x}$, and the first section and the second section are formed of $Si_yGe_{1-y}$, where $0 \leq x < y \leq 1$.

* * * * *